(12) United States Patent
Lee et al.

(10) Patent No.: US 12,211,829 B2
(45) Date of Patent: Jan. 28, 2025

(54) SEMICONDUCTOR PACKAGE

(71) Applicant: Samsung Electronics Co., Ltd., Suwon-si (KR)

(72) Inventors: Manho Lee, Hwaseong-si (KR); Eunseok Song, Hwaseong-si (KR); Kyungsuk Oh, Seongnam-si (KR); Seonghwan Jeon, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/121,664

(22) Filed: Mar. 15, 2023

(65) Prior Publication Data

US 2023/0223390 A1    Jul. 13, 2023

Related U.S. Application Data

(63) Continuation of application No. 17/243,127, filed on Apr. 28, 2021, now Pat. No. 11,631,660.

(30) Foreign Application Priority Data

Aug. 24, 2020  (KR) .................. 10-2020-0106429
Oct. 21, 2020  (KR) .................. 10-2020-0137085

(51) Int. Cl.
*H01L 25/18*    (2023.01)
*H01L 21/56*    (2006.01)
(Continued)

(52) U.S. Cl.
CPC ............ *H01L 25/18* (2013.01); *H01L 21/565* (2013.01); *H01L 23/3128* (2013.01);
(Continued)

(58) Field of Classification Search
CPC ................................................. H01L 25/0652
See application file for complete search history.

(56) References Cited

U.S. PATENT DOCUMENTS 8,796,861 B2    8/2014  Kim et al.
9,099,460 B2    8/2015  Cho et al.
(Continued)

FOREIGN PATENT DOCUMENTS

KR    10-2013-0137482 A    12/2013
KR    1020130026800 B1    10/2018

OTHER PUBLICATIONS

Office Action dated May 23, 2024 for corresponding Korean Patent Aapplication No. KR 10-2020-0137085.
Notice of Allowance dated Nov. 12, 2024 for corresponding KR Patent Application No. 10-2020-0137085.

*Primary Examiner* — Yu-Hsi D Sun
(74) *Attorney, Agent, or Firm* — Muir Patent Law, PLLC

(57) ABSTRACT

A semiconductor package according to the inventive concept includes a first semiconductor chip configured to include a first semiconductor device, a first semiconductor substrate, a plurality of through electrodes penetrating the first semiconductor substrate, and a plurality of first chip connection pads arranged on an upper surface of the first semiconductor substrate; a plurality of second semiconductor chips sequentially stacked on an upper surface of the first semiconductor chip and configured to each include a second semiconductor substrate, a second semiconductor device controlled by the first semiconductor chip, and a plurality of second chip connection pads arranged on an upper surface of the second semiconductor substrate; a plurality of bonding wires configured to connect the plurality of first chip connection pads to the plurality of second chip connection pads; and a plurality of external connection terminals arranged on a lower surface of the first semiconductor chip.

20 Claims, 30 Drawing Sheets

(51) Int. Cl.
    *H01L 23/00*     (2006.01)
    *H01L 23/31*     (2006.01)
    *H01L 23/48*     (2006.01)
    *H01L 23/495*     (2006.01)
    *H01L 23/538*     (2006.01)
    *H01L 25/00*     (2006.01)
    *H01L 25/065*     (2023.01)
    *H10B 80/00*     (2023.01)

(52) U.S. Cl.
    CPC ........ *H01L 23/481* (2013.01); *H01L 23/4952* (2013.01); *H01L 23/5383* (2013.01); *H01L 24/16* (2013.01); *H01L 24/48* (2013.01); *H01L 24/73* (2013.01); *H01L 25/0652* (2013.01); *H01L 25/0657* (2013.01); *H01L 25/50* (2013.01); *H10B 80/00* (2023.02); *H01L 2224/16227* (2013.01); *H01L 2224/48145* (2013.01); *H01L 2224/73257* (2013.01); *H01L 2224/73265* (2013.01); *H01L 2225/06506* (2013.01); *H01L 2225/06541* (2013.01); *H01L 2225/06575* (2013.01); *H01L 2225/06586* (2013.01); *H01L 2924/1431* (2013.01); *H01L 2924/1436* (2013.01)

(56) References Cited

U.S. PATENT DOCUMENTS

| | | | |
|---|---|---|---|
| 9,252,123 | B2 | 2/2016 | Han et al. |
| 9,466,571 | B2 | 10/2016 | Fai et al. |
| 10,128,211 | B2 | 11/2018 | Chang et al. |
| 10,446,527 | B2 | 10/2019 | Nakano |
| 2017/0243855 | A1* | 8/2017 | Kim .................... H01L 25/0657 |
| 2019/0067248 | A1 | 2/2019 | Yoo et al. |
| 2019/0237431 | A1 | 8/2019 | Kim |
| 2019/0278511 | A1 | 9/2019 | Lee et al. |
| 2020/0013753 | A1* | 1/2020 | Kim ...................... H01L 23/528 |
| 2020/0066640 | A1 | 2/2020 | Sarkar et al. |
| 2020/0118993 | A1 | 4/2020 | Kang et al. |

* cited by examiner

SEMICONDUCTOR PACKAGE

CROSS-REFERENCE TO RELATED APPLICATIONS

This application is a continuation of U.S. patent application Ser. No. 17/243,127, filed Apr. 28, 2021, in the U.S. Patent and Trademark Office, which claims the benefits of priority under 35 U.S.C. § 119 to Korean Patent Application No. 10-2020-0106429, filed Aug. 24, 2020, and Korean Patent Application No. 10-2020-0137085, filed Oct. 21, 2020, in the Korean Intellectual Property Office, the disclosures of all of which are incorporated herein in their entireties by reference.

BACKGROUND

The inventive concept relates to a semiconductor package, and more particularly, to a semiconductor package including a plurality of semiconductor chips.

With the rapid development of the electronics industry and increasing user demand, electronic products are more compact and lighter, and for this purpose, semiconductor packages mounted on the electronic products need to have various functions while being reduced in size. Accordingly, a semiconductor package including a plurality of semiconductor chips has been developed.

SUMMARY

The inventive concept provides a semiconductor package including a plurality of semiconductor chips.

In order to solve the above technical problem, the inventive concept provides a semiconductor package as follows.

According to an embodiment, a semiconductor package includes a first semiconductor chip configured to include a first semiconductor device, a first semiconductor substrate, a plurality of through electrodes penetrating the first semiconductor substrate, and a plurality of first chip connection pads arranged on an upper surface of the first semiconductor substrate; a plurality of second semiconductor chips sequentially stacked on an upper surface of the first semiconductor chip and configured to each include a second semiconductor substrate, a second semiconductor device controlled by the first semiconductor chip, and a plurality of second chip connection pads arranged on an upper surface of the second semiconductor substrate; a plurality of bonding wires configured to connect the plurality of first chip connection pads to the plurality of second chip connection pads; a molding layer configured to surround the plurality of second semiconductor chips and the plurality of bonding wires; and a plurality of external connection terminals arranged on a lower surface of the first semiconductor chip.

According to another embodiment, a semiconductor package includes a first semiconductor chip configured to include a first semiconductor substrate including a first semiconductor device, a wiring layer arranged on an active surface of the first semiconductor substrate and including a plurality of conductive wiring patterns and an inter-wire insulating layer surrounding the plurality of conductive wiring patterns, a plurality of through electrodes penetrating the first semiconductor substrate and electrically connected to the first semiconductor device, a plurality of first chip connection pads arranged on an upper surface of the first semiconductor chip, and a plurality of external connection pads arranged on a lower surface of the first semiconductor chip; a plurality of second chips configured to each include a second semiconductor substrate having a die adhesive film attached to a lower surface of each of the second semiconductor chips and stacked on an upper surface of the first semiconductor chip, a second semiconductor device controlled by the first semiconductor chip, and a plurality of second chip connection pads arranged on an upper surface of each of the second semiconductor chips; a plurality of bonding wires configured to connect the plurality of first chip connection pads to the plurality of second chip connection pads; a molding layer configured to cover the upper surface of the first semiconductor chip and configured to surround the plurality of second semiconductor chips and the plurality of bonding wires; and a plurality of external connection terminals attached to the plurality of external connection pads.

According to another embodiment, a semiconductor package includes a redistribution structure configured to include a redistribution insulating layer, a plurality of redistribution line patterns arranged on at least one of an upper surface and a lower surface of the redistribution insulating layer, and a plurality of redistribution vias which penetrate the redistribution insulating layer to be respectively connected and in contact with some of the plurality of redistribution line patterns and which increasingly extend from a lower side to an upper side of each of the redistribution vias; a logic semiconductor chip arranged on the redistribution structure and configured to include a first semiconductor substrate, a wiring layer which is arranged on an active surface of the first semiconductor substrate and includes a plurality of conductive wiring patterns and an inter-wire insulating layer surrounding the plurality of conductive wiring pattens, a plurality of first chip connection pads arranged on an upper surface, and a plurality of through electrodes which are connected to the plurality of first chip connection pads and penetrate the first semiconductor substrate; a supporter arranged on the redistribution structure to be spaced apart from the logic semiconductor chip and configured to include an upper surface at the same vertical level as the upper surface of the first semiconductor substrate; a plurality of dynamic random access memory (DRAM) chips configured to each have a die adhesive film attached to a lower surface of each the plurality of DRAM chips so that edges of the plurality of DRAM chips are aligned with each other in a vertical direction and sequentially stacked over an inactive surface of the first semiconductor substrate and the supporter, and configured to include a second semiconductor substrate, a DRAM device controlled by the logic semiconductor chip, and a plurality of second chip connection pads arranged on an upper surface of each of the plurality of DRAM chips, and configured to have a data bus having a width of 16 to 64 bits; a plurality of bonding wires configured to each include one end attached to a corresponding one of the plurality of first chip connection pads and the other end attached to a corresponding one of the plurality of second chip connection pads and the plurality of bonding wires are configured to extend from the plurality of second chip connection pads to the plurality of first chip connection pads; a molding layer configured to cover an upper surface of the redistribution structure and configured to surround the plurality of DRAM chips and the plurality of bonding wires; and a plurality of external connection terminals attached to a lower surface of the redistribution structure.

BRIEF DESCRIPTION OF THE DRAWINGS

Embodiments of the inventive concept will be more clearly understood from the following detailed description taken in conjunction with the accompanying drawings in which numerals refer to like elements throughout. In the drawings.

DETAILED DESCRIPTION OF THE EMBODIMENTS

Figure 1:
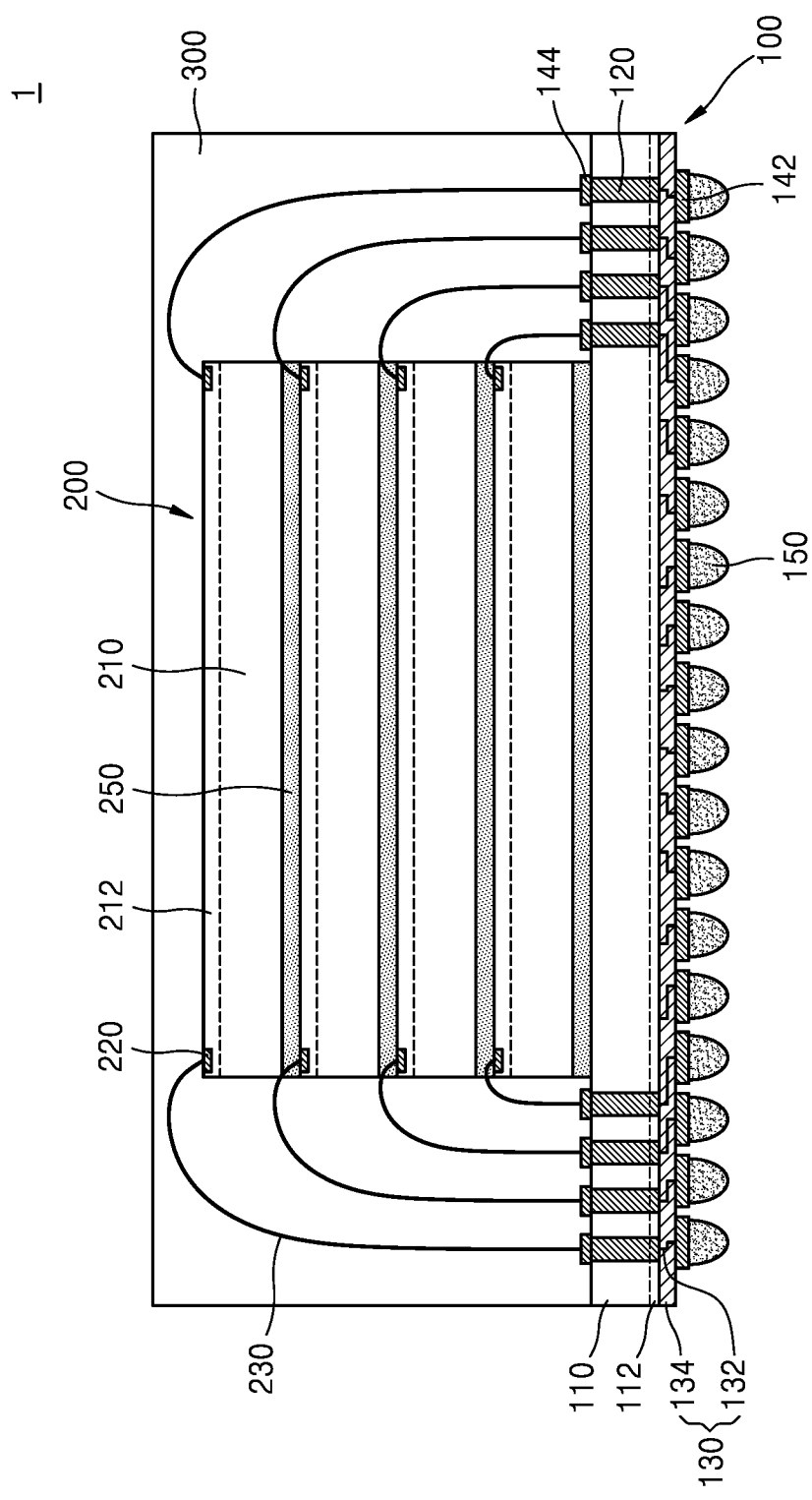
FIGS. 1 and 2 are cross-sectional views of semiconductor packages, according to example embodiments of the inventive concept.
Figure 2:
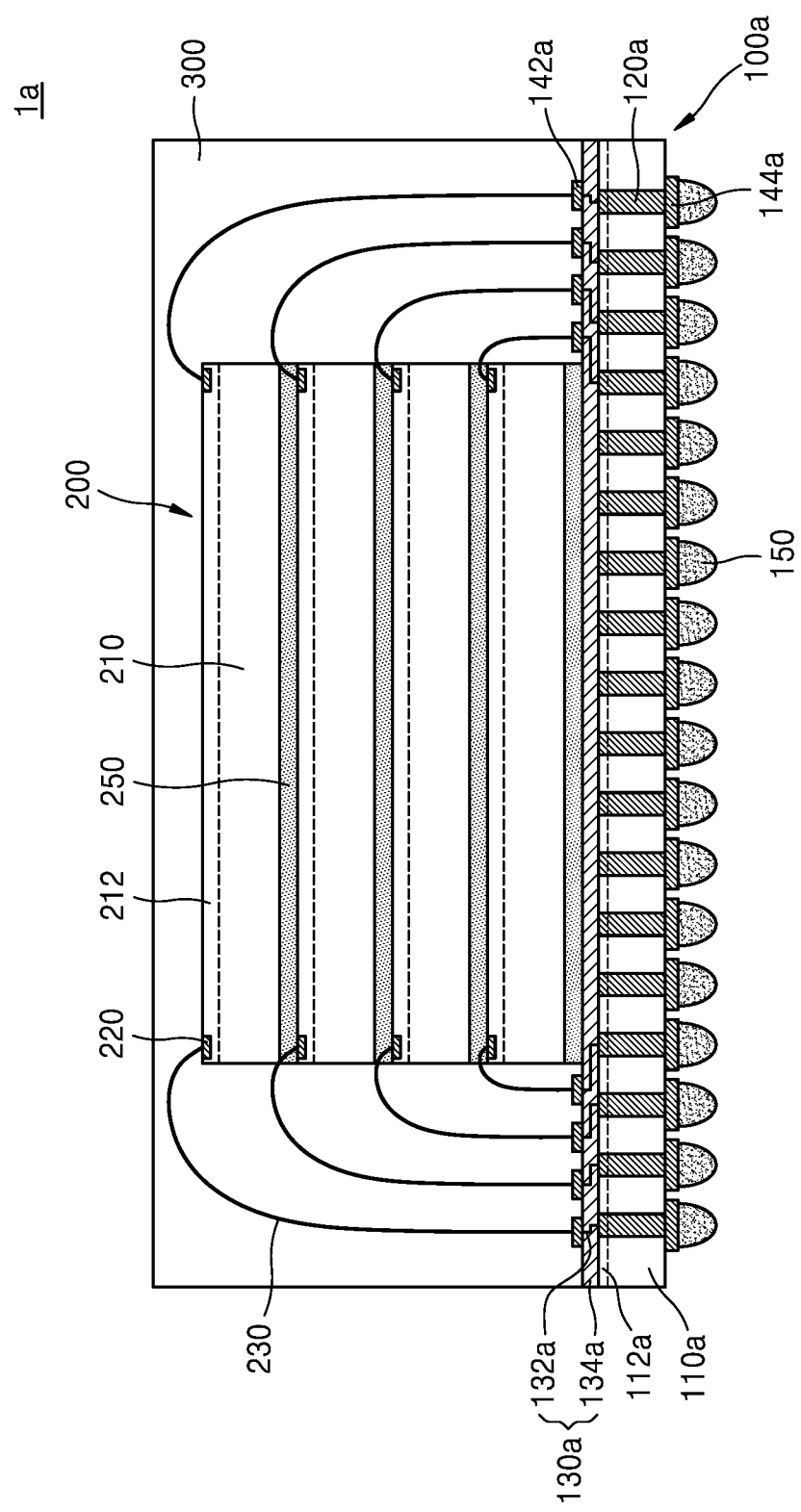

FIGS. 1 and 2 are cross-sectional views of semiconductor packages, according to example embodiments of the inventive concept.

Referring to FIG. 1, a semiconductor package 1 includes a first semiconductor chip 100 and a plurality of second semiconductor chips 200 sequentially stacked on the first semiconductor chip 100. In some embodiments, four or eight second semiconductor chips 200 may be stacked on one first semiconductor chip 100. In some embodiments, each of the plurality of second semiconductor chips 200 may be a memory semiconductor chip including a memory device, and the first semiconductor chip 100 may be a logic semiconductor chip including circuits for controlling the memory device of each of the second semiconductor chips 200, such as a dynamic random access memory (DRAM) device or a flash memory device.

The first semiconductor chip 100 may be referred to as a base die, a base chip, a controller die, a controller chip, a buffer die, or a buffer chip. The second semiconductor chip 200 may be referred to as a memory die, a memory chip, a core die, or a core chip. In some embodiments, when the second semiconductor chip 200 includes a DRAM device, the second semiconductor chip 200 may be referred to as a DRAM die or a DRAM chip. In some embodiments, when the second semiconductor chip 200 includes a flash memory device, the second semiconductor chip 200 may be referred to as a flash memory die or a flash memory chip.

The first semiconductor chip 100 may include a first semiconductor substrate 110 having a first semiconductor device 112 formed in an active surface thereof, and a wiring layer 130 arranged on the active surface of the first semiconductor substrate 110. The first semiconductor chip 100 may further include a plurality of through electrodes 120 penetrating at least a portion between an upper surface and a lower surface of the first semiconductor chip 100. In some embodiments, the plurality of through electrodes 120 may penetrate between an inactive surface of the first semiconductor substrate 110 (e.g., an upper surface of the first semiconductor chip 100) and an active surface of the first semiconductor substrate 110 (e.g., a lower surface of the first semiconductor chip 100).

The first semiconductor chip 100 may have a face-down arrangement in which the active surface of the first semiconductor substrate 110 faces downward. The inactive surface of the first semiconductor substrate 110 may face the plurality of second semiconductor chips 200.

In the present specification, the upper and lower surfaces of a semiconductor chip refer to upper and lower surfaces in the drawings, and front and rear surfaces of the semiconductor chip refer to the active surface and the inactive surface of the semiconductor substrate. For example, in FIG. 1, an upper surface of the first semiconductor chip 100 may refer to a rear surface thereof, and a lower surface thereof may refer to a front surface thereof.

The first semiconductor chip 100 may further include a plurality of front pads 142, which are arranged on a lower surface and connected to conductive wiring patterns 132 and a plurality of rear pads 144 which are arranged on an upper surface and are each connected to one end of each of the plurality of through electrodes 120. In some embodiments, each of the plurality of rear pads 144 may contact a surface of a corresponding one of the plurality of through electrodes 120.

The first semiconductor substrate 110 may include a semiconductor material such as silicon (Si) or germanium (Ge). Alternatively, the first semiconductor substrate 110 may include a compound semiconductor material such as silicon carbide (SiC), gallium arsenide (GaAs), indium arsenide (InAs), and indium phosphide (InP). The first semiconductor substrate 110 may include a conductive region, for example, a well doped with impurities. The first semiconductor substrate 110 may have various device isolation structures such as a shallow trench isolation (STI) structure.

The first semiconductor device 112 including a plurality of individual devices of various types may be formed in an active surface of the first semiconductor substrate 110. The plurality of individual devices may include various microelectronic devices, for example, a metal-oxide-semiconductor field effect transistor (MOSFET) such as a complementary metal-oxide-semiconductor (CMOS) transistor, a system large scale integration (LSI), an active device, a passive device, and the like. The plurality of individual devices may be electrically connected to the conductive region of the first semiconductor substrate 110. The first semiconductor device 112 may further include conductive wires or conductive plugs that electrically connect at least two of the plurality of individual devices to each other, or the plurality of individual devices to the conductive region of the first semiconductor substrate 110. In addition, the plurality of individual devices may be electrically separated from other neighboring individual devices by an insulating layer.

The plurality of through electrodes 120 may penetrate at least a portion between upper and lower surfaces of the first semiconductor chip 100. The plurality of through electrodes 120 may be electrically connected to the first semiconductor device 112. In some embodiments, the plurality of through electrodes 120 may penetrate from the upper surface to the lower surface of the first semiconductor substrate 110. In some embodiments, the plurality of through electrodes 120 may penetrate from the upper surface to the lower surface of the first semiconductor substrate 110 and then penetrate at least a portion of the wiring layer 130 also to extend into the wiring layer 130.

Each of the plurality of through electrodes 120 may include a conductive plug penetrating at least a portion of the first semiconductor chip 100 and a conductive barrier layer surrounding the conductive plug. The conductive plug may have a columnar shape, and the conductive barrier layer may have a cylindrical shape surrounding a sidewall of the conductive plug. A plurality of via insulating layers may be between the first semiconductor substrate 110 and the plurality of through electrodes 120 to surround sidewalls of the plurality of through electrodes 120.

The conductive plug may be formed of Cu, CuSn, CuMg, CuNi, CuZn, CuPd, CuAu, CuRe, CuW, W, or W alloy, but is not limited thereto. The conductive plug may include one or more of, for example, Al, Au, Be, Bi, Co, Cu, Hf, In, Mn, Mo, Ni, Pb, Pd, Pt, Rh, Re, Ru, Ta, Te, Ti, W, Zn, and Zr and may include one or more stack structures. The conductive barrier layer may include at least one selected from, for example, W, WN, WC, Ti, TiN, Ta, TaN, Ru, Co, Mn, WN, Ni, and NiB, but is limited thereto. The via insulating layer may be formed of an oxide layer, a nitride layer, a carbide layer, a polymer, or a combination thereof. The via insulating layer may include, for example, a high aspect ratio process (HARP) oxide layer based on ozone/tetra-ethyl orthosilicate ($O_3$/TEOS).

The wiring layer 130 may include a plurality of conductive wiring patterns 132 and an inter-wire insulating layer 134 surrounding the plurality of conductive wiring patterns 132. The plurality of conductive wiring patterns 132 may be formed of wiring lines and wiring vias. In some embodiments, the plurality of conductive wiring patterns 132 may have a multilayer wiring structure including wiring lines and wiring vias at different vertical levels, and the inter-wire insulating layer 134 may have a multi-layer structure in which a plurality of insulating layers are stacked to correspond to the multi-layer wiring structure of the plurality of conductive wiring patterns 132.

The plurality of conductive wiring patterns 132 may include a metal material such as aluminum, copper, or tungsten. In some embodiments, the plurality of conductive wiring patterns 132 may include a barrier layer for wiring and a metal layer for wiring. The barrier layer for wiring may be formed of nitride or oxide of a metal such as Ti, Ta, Ru, Mn, Co, or W or may be formed of an alloy such as cobalt tungsten phosphide (CoWP), cobalt tungsten boron (CoWB), or cobalt tungsten boron phosphide (CoWBP). The metal layer for wiring may include at least one metal selected from W, Al, Ti, Ta, Ru, Mn, and Cu. The inter-wire insulating layer 134 may be formed of, for example, silicon oxide. In some embodiments, the inter-wire insulating layer 134 may be formed of tetraethyl orthosilicate (TEOS). In some embodiments, the inter-wire insulating layer 134 may be formed of an insulating material having a lower dielectric constant than silicon oxide. For example, the inter-wire insulating layer 134 may include an ultra-low k (ULK) film having an ultra-low dielectric constant K of approximately 2.2 to 2.4. The ULK film may include a SiOC film or a SiCOH film.

A plurality of external connection terminals 150 may be attached onto the plurality of front pads 142. In some embodiments, each of the external connection terminals 150 may be a conductive bump. The external connection terminals 150 may electrically connect the semiconductor package 1 to an external apparatus. The front pads 142 may each be referred to as an external connection pad.

The plurality of second semiconductor chips 200 may be sequentially stacked on the first semiconductor chip 100. The plurality of second semiconductor chips 200 may be sequentially stacked on an inactive surface of the first semiconductor substrate 110. The plurality of second semiconductor chips 200 may be sequentially stacked on the first semiconductor chip 100 in a vertical direction. The plurality of second semiconductor chips 200 may be stacked to overlap each other in the vertical direction. Edges of the plurality of second semiconductor chips 200 may be aligned with each other in the vertical direction. Each of the plurality of second semiconductor chips 200 may have a face-up arrangement in which an active surface of a second semiconductor substrate 210 faces upward. For example, the active surface of each second semiconductor substrate 210 may face away from the first semiconductor chip 100.

The plurality of second semiconductor chips 200 may each have a die adhesive film 250 attached to a lower surface thereof and may each be attached to a structure thereunder. For example, the second semiconductor chip 200 at the bottom of the plurality of second semiconductor chips 200 is attached on the first semiconductor chip 100 with the die adhesive film 250 therebetween, and the rest of the second semiconductor chips 200 have the die adhesive films 250 therebetween and may be attached to the second semiconductor chips 200 on a lower side thereof. The second semiconductor chip 200 and the die adhesive film 250 attached to a lower surface of the second semiconductor chip 200 may have the same horizontal width and the same horizontal area.

In some embodiments, the horizontal width and the horizontal area of the second semiconductor chip 200 may be less than a horizontal width and a horizontal area of the first semiconductor chip 100. For example, the plurality of second semiconductor chips 200 may be stacked to all overlap within the first semiconductor chip 100 in a vertical direction.

Each of the second semiconductor chips 200 may include the second semiconductor substrate 210 having a second semiconductor device 212 formed in an active surface thereof, and a plurality of chip connection pads 220 arranged on an upper surface thereof. The plurality of chip connection pads 220 may be edge pads arranged adjacent to an edge of an upper surface of the second semiconductor substrate 210. Because the second semiconductor substrate 210 and the second semiconductor device 212 are substantially the same as the first semiconductor substrate 110 and the first semiconductor device 112, redundant descriptions thereof are omitted. The second semiconductor chip 200 may also include a wiring layer similar to the wiring layer 130 of the first semiconductor chip 100, which is omitted for the sake of convenience of illustration.

The second semiconductor device 212 may be, for example, a memory device. For example, the second semiconductor device 212 may be dynamic random access memory (DRAM) or flash memory.

One end of each of the plurality of bonding wires 230 may be attached to a corresponding one of the chip connection pads 220 of the plurality of second semiconductor chips 200, and the other end of each of the plurality of bonding wires 230 may be attached to a corresponding one of a plurality of rear pads 144. The plurality of bonding wires 230 may directly connect the plurality of chip connection pads 220 of each of the plurality of second semiconductor chips 200 corresponding to each other to the plurality of rear pads 144 of the first semiconductor chip 100. Each of the plurality of second semiconductor chips 200 and the first semiconductor chip 100 may be electrically connected to each other through different bonding wires 230 among the plurality of bonding wires 230.

The rear pad 144 of the first semiconductor chip 100 may be referred to as a first chip connection pad, and the chip connection pad 220 of the second semiconductor chip 200 may be referred to as a second chip connection pad. For example, the bonding wire 230 connects the first chip connection pad to the second chip connection pad and may extend from the first chip connection pad to the second chip connection pad.

The die adhesive film 250 may cover the plurality of chip connection pads 220 of the second semiconductor chip 200 thereunder. A portion of one end of each of the plurality of bonding wires 230 connected to the plurality of chip connection pads 220 may be buried inside the die adhesive film 250. The die adhesive film 250 may be formed of, for example, an inorganic adhesive or a polymer adhesive. The polymer adhesive may include, for example, a thermosetting polymer or a thermoplastic resin. The thermosetting resin has a three-dimensional cross-link structure after monomer is heat-molded and does not soften even when reheated. In contrast to this, the thermoplastic resin exhibits plasticity by heating and has a structure of a linear polymer. In addition, the polymer adhesive may also be formed in a hybrid type made by mixing the two components.

The plurality of second semiconductor chips 200 may be attached to a portion of the first semiconductor chip 100 overlapping the plurality of second semiconductor chips 200 in a vertical direction, and the plurality of rear pads 144 connected to the plurality of bonding wires 230 may be connected the rest of the first semiconductor chip 100 that does not overlap the plurality of second semiconductor chips 200 in the vertical direction.

Some of the plurality of chip connection pads 220 of each of the plurality of second semiconductor chips 200 may be data pads for transmitting a data DQ signal. For example, the number of data pads of each of the plurality of second semiconductor chips 200 may be 16 to 64. For example, a width of a data bus of each of the plurality of second semiconductor chips 200 may be 16 to 64 bits.

Some of the plurality of rear pads 144 on the first semiconductor chip 100 may be data connection pads connected to the data pads of the plurality of second semiconductor chips 200. The data pads of the plurality of second semiconductor chips 200 and the data connection pads of the first semiconductor chip 100 may be connected 1:1 through different bonding wires 230. For example, the number of data connection pads of the first semiconductor chip 100 may be obtained by multiplying the number of data pads included in each of the plurality of second semiconductor chips 200 by the number of second semiconductor chips 200 stacked on the first semiconductor chip 100. For example, the number of data connection pads of the first semiconductor chip 100 may be 64 to 256, and a width of the data bus of the semiconductor package 1 may be 64 to 256 bits.

The plurality of chip connection pads 220 of the plurality of second semiconductor chips 200 and the plurality of rear pads 144 of the first semiconductor chip 100 may be electrically connected to each other through the plurality of bonding wires 230, and the plurality of rear pads 144 of the semiconductor package 1 and the first semiconductor device 112 may be electrically connected to each other through the plurality of through electrodes 120. The first semiconductor device 112 may transmit and receive data to and from an external apparatus through the plurality of external connection terminals 150. At least some of the plurality of conductive wiring patterns 132 in the wiring layer 130 may electrically connect the first semiconductor device 112 to the plurality of external connection terminals 150. In some embodiments, some of the plurality of conductive wiring patterns 132 may electrically connect the plurality of through electrodes 120 to the first semiconductor device 112. In some embodiments, some of the plurality of conductive wiring patterns 132 may directly and electrically connect some of the plurality of through electrodes 120 to some of the plurality of external connection terminals 150.

The semiconductor package 1 may further include a molding layer 300 that is formed on the first semiconductor chip 100 to cover an upper surface of the first semiconductor chip 100 and to surround the plurality of second semiconductor chips 200 and the plurality of bonding wires 230. The molding layer 300 may include, for example, an epoxy mold compound (EMC). In some embodiments, a horizontal width and a horizontal area of the molding layer 300 may be the same as the horizontal width and the horizontal area of the first semiconductor chip 100. For example, a sidewall of the first semiconductor chip 100 may be aligned with a sidewall of the molding layer 300 in a vertical direction to form a coplanar surface.

In the semiconductor package 1 according to the inventive concept, a width of a data bus of the semiconductor package 1 is determined by multiplying the number of second semiconductor chips 200 by a width of a data bus of each of the plurality of second semiconductor chips 200. For example, when the semiconductor package 1 includes four second semiconductor chips 200 and a width of a data bus of the second semiconductor chip 200 is 32 bits, the width of the data bus of the first semiconductor package 1 may be 4×32 bits, that is, 128 bits. The semiconductor package 1 according to the inventive concept may be called wide bandwidth memory (WBM), which has a data bus having a width of tens to several hundreds of bits compared to high bandwidth memory (HBM) including a data bus having a width of 1024 bits or more.

Accordingly, the semiconductor package 1 according to the inventive concept may have a relatively large width of a data bus at a relatively low manufacturing cost by electrically connecting the first semiconductor chip 100 to the plurality of second semiconductor chips 200 through the plurality of bonding wires 230. In addition, data may be transmitted and received to and from an external apparatus through the plurality of external connection terminals 150 attached to the first semiconductor chip 100, and thus, a manufacturing cost may be reduced because there is no need to have a relatively high-cost configuration such as a silicon interposer.

Referring to FIG. 2, a semiconductor package 1*a* includes a first semiconductor chip 100*a* and a plurality of second semiconductor chips 200 sequentially stacked on the first semiconductor chip 100*a*. The first semiconductor chip 100*a* may be a logic semiconductor chip including circuits for controlling memory devices of the second semiconductor chips 200.

The first semiconductor chip 100*a* may include a first semiconductor substrate 110*a* having a first semiconductor device 112*a* formed in an active surface thereof, and a wiring layer 130*a* which is arranged on the active surface of the first semiconductor substrate 110*a* and includes a plurality of conductive wiring patterns 132*a* and an inter-wire insulating layer 134*a*. The first semiconductor chip 100*a* may further include a plurality of through electrodes 120*a* penetrating at least a portion between upper and lower surfaces of the first semiconductor chip 100a. The first semiconductor chip 100a may have a face-up arrangement in which the active surface of the first semiconductor substrate 110a faces upward. For example, the active surface of the first semiconductor substrate 110a may face the plurality of second semiconductor chips 200. The first semiconductor chip 100a may further include a plurality of front pads 142a that are arranged on an upper surface thereof and connected to the conductive wiring patterns 132a, and a plurality of rear pads 144a that are arranged on a lower surface thereof and each connected to one end of a corresponding one of the plurality of through electrodes 120a.

The first semiconductor substrate 110a, the first semiconductor device 112a, the through electrodes 120a, the wiring layer 130a, the front pads 142a, and the rear pads 144a are substantially the same as the first semiconductor substrate 110, the first semiconductor device 112, the through electrodes 120, the wiring layer 130, the front pads 142, and the rear pads 144 illustrated in FIG. 1, and thus, redundant descriptions thereof are omitted and a difference therebetween will be mainly described. As used herein, terms such as "same" or "equal" encompass near identicality including variations that may occur, for example, due to manufacturing processes. The term "substantially" may be used herein to emphasize this meaning, unless the context or other statements indicate otherwise.

The plurality of second semiconductor chips 200 may be sequentially stacked on the wiring layer 130a arranged on the active surface of the first semiconductor substrate 110a.

One end of each of the plurality of bonding wires 230 may be attached to a corresponding one of the chip connection pads 220 of the plurality of second semiconductor chips 200, and the other end of each of the plurality of bonding wires 230 may be attached to a corresponding one of the plurality of front pads 142a. The bonding wires 230 may connect the chip connection pads 220 of the plurality of second semiconductor chips 200 to the plurality of front pads 142a of the first semiconductor chip 100a.

The front pads 142a of the first semiconductor chip 100a may each be referred to as a first chip connection pad, and the chip connection pads 220 of the second semiconductor chips 200 may each be referred to as a second chip connection pad. For example, the bonding wires 230 may each connect the first chip connection pad to the second chip connection pad and may each extend from the first chip connection pad to the second chip connection pad.

The plurality of second semiconductor chips 200 are attached to a portion of the first semiconductor chip 100a overlapping the plurality of second semiconductor chips 200 in a vertical direction, and the plurality of front pads 142a connected to the plurality of bonding wires 230 may be arranged on the remaining portion of the first semiconductor chip 100a that does not overlap the plurality of second semiconductor chips 200 in the vertical direction.

Some of the plurality of chip connection pads 220 of each of the plurality of second semiconductor chips 200 may be data pads for transmitting a data DQ signal. Some of the plurality of front pads 142a of the first semiconductor chip 100a may be data connection pads connected to the data pads of the plurality of second semiconductor chips 200. The data pads of the plurality of second semiconductor chips 200 and the data connection pads of the first semiconductor chip 100a may be connected 1:1 through different bonding wires 230.

The plurality of chip connection pads 220 of the plurality of second semiconductor chips 200 are electrically connected to the plurality of front pads 142a of the first semiconductor chip 100a through the plurality of bonding wires 230, and the plurality of front pads 142a of the semiconductor package 1a may be electrically connected to the first semiconductor device 112a through the plurality of conductive wiring patterns 132a. The first semiconductor device 112a may transmit and receive data to and from an external apparatus through the plurality of external connection terminals 150 attached on the plurality of rear pads 144a. At least some of the plurality of through electrodes 120a may electrically connect the first semiconductor device 112a to the plurality of external connection terminals 150. In some embodiments, some of the plurality of through electrodes 120a may directly and electrically connect some of the plurality of conductive wiring patterns 132a to some of the plurality of external connection terminals 150.

The semiconductor package 1a according to the inventive concept may have a relatively large data bus width at a relatively low manufacturing cost.

FIGS. 3A to 3D are cross-sectional views sequentially illustrating a method of manufacturing a semiconductor package, according to example embodiments of the inventive concept. Specifically, FIGS. 3A to 3D are cross-sectional views sequentially illustrating a method of manufacturing the semiconductor package illustrated in FIG. 1.

Figure 3A:
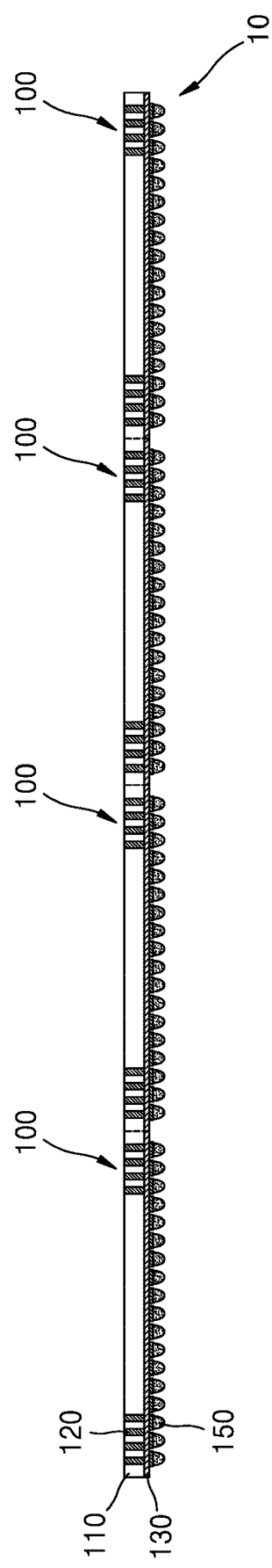
FIGS. 3A to 3D are cross-sectional views sequentially illustrating a method of manufacturing a semiconductor package, according to an example embodiment of the inventive concept.

Referring to FIG. 3A, a base substrate 10 is prepared. The base substrate 10 may be, for example, a silicon wafer. The base substrate 10 may include a plurality of first semiconductor chips 100. In this case, the plurality of first semiconductor chips 100 included in the base substrate 10 refer to portions to be separated and individualized into the plurality of first semiconductor chips 100 afterwards. For example, the base substrate 10 may be formed by forming the first semiconductor device 112, the plurality of through electrodes 120, the wiring layer 130, the plurality of front pads 142, and the plurality of rear pads 144 to be included in each of the plurality of first semiconductor chips 100 on the first semiconductor substrate 110.

In some embodiments, the plurality of external connection terminals 150 may be attached on the plurality of front pads 142. In some embodiments, the plurality of external connection terminals 150 may be attached on the plurality of front pads 142 before performing an individualization process illustrated in FIG. 3D.

Figure 3B:
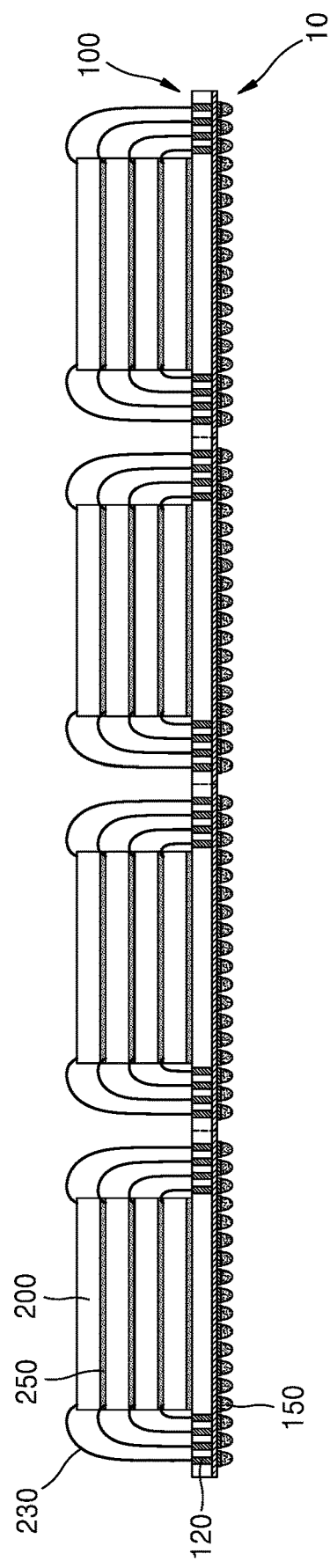

Referring to FIG. 3B, the plurality of second semiconductor chips 200 are stacked on the base substrate 10 to correspond to each of the plurality of first semiconductor chips 100. The plurality of second semiconductor chips 200 may each have the die adhesive film 250 attached to a lower surface thereof and may be sequentially stacked on an inactive surface of the first semiconductor substrate 110 included in the base substrate 10. After the lowermost second semiconductor chip 200 corresponding to each of the plurality of first semiconductor chips 100 is attached onto the base substrate 10, the bonding wires 230 connecting the chip connection pad 220 of the lowermost second semiconductor chip 200 to the rear pad 144 may be formed. Thereafter, another second semiconductor chip 200 is attached onto the lowermost second semiconductor chip 200, and another second semiconductor chip is attached onto the base substrate 10 to which the lowermost second semiconductor chip 200 is attached, and then, a process of forming the bonding wires 230 connecting the chip connection pads 220 of another second semiconductor chip 200 to the rear pads 144 may be repeatedly performed.

Figure 3C:
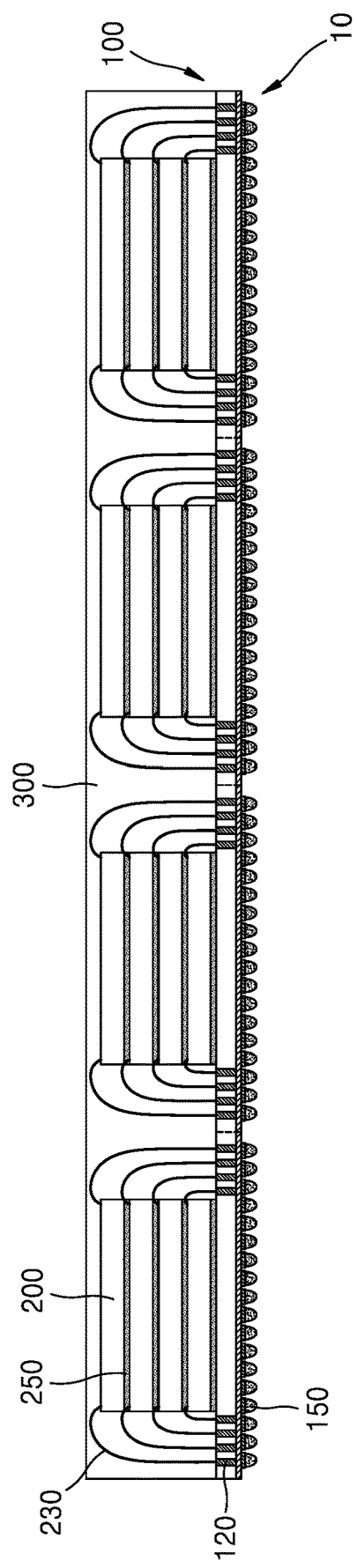
Figure 3D:
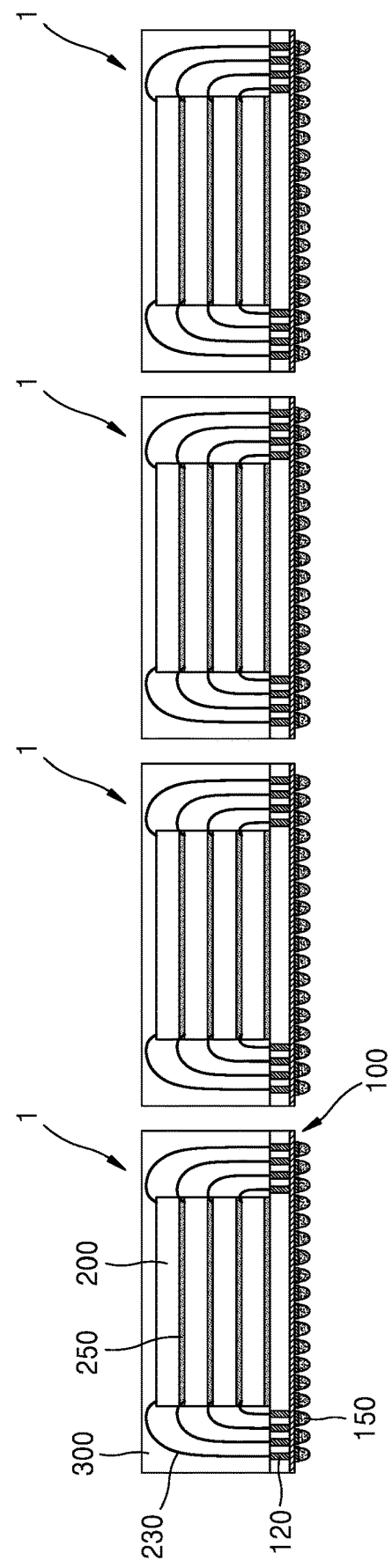

Referring to FIGS. 3C and 3D, the molding layer 300 surrounding the plurality of second semiconductor chips 200 and the plurality of bonding wires 230 is formed on the base substrate 10.

Thereafter, an individualization process of cutting the base substrate 10 and the molding layer 300 to separate the base substrate 10 into the plurality of first semiconductor chips 100 is performed, and thus, the plurality of semiconductor packages 1 may be obtained.

The semiconductor package 1a illustrated in FIG. 2 may be formed by preparing a base substrate including the plurality of first semiconductor chips 100a so that directions of an active surface and an inactive surface of the first semiconductor substrate 110a are opposite to directions of an active surface and an inactive surface of the first semiconductor substrate 110, by referring to the method of manufacturing the semiconductor package 1 described with reference to FIGS. 3A to 3D.

Figure 4:
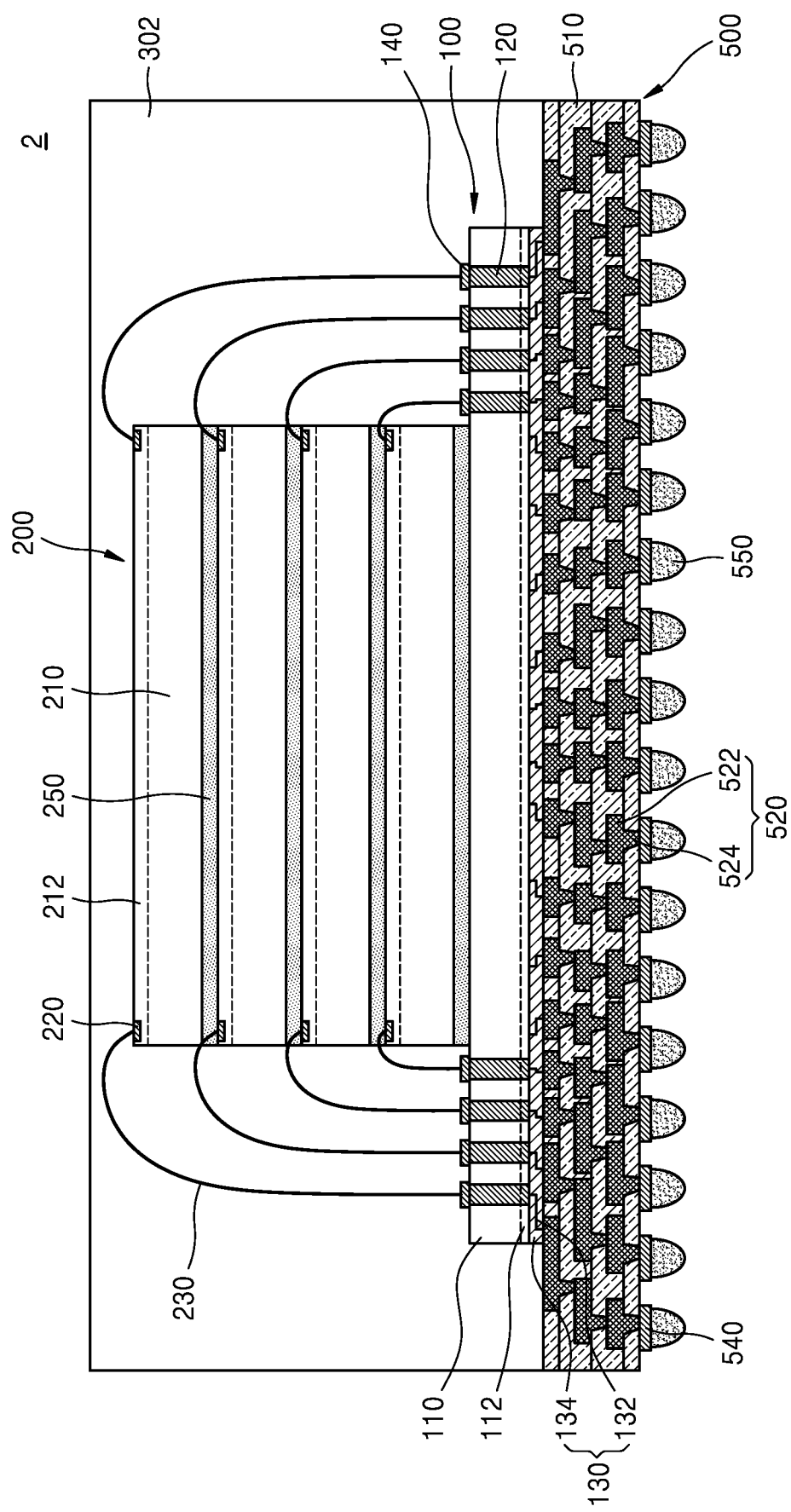
FIGS. 4 and 5 are cross-sectional views of semiconductor packages, according to example embodiments of the inventive concept.
Figure 5:
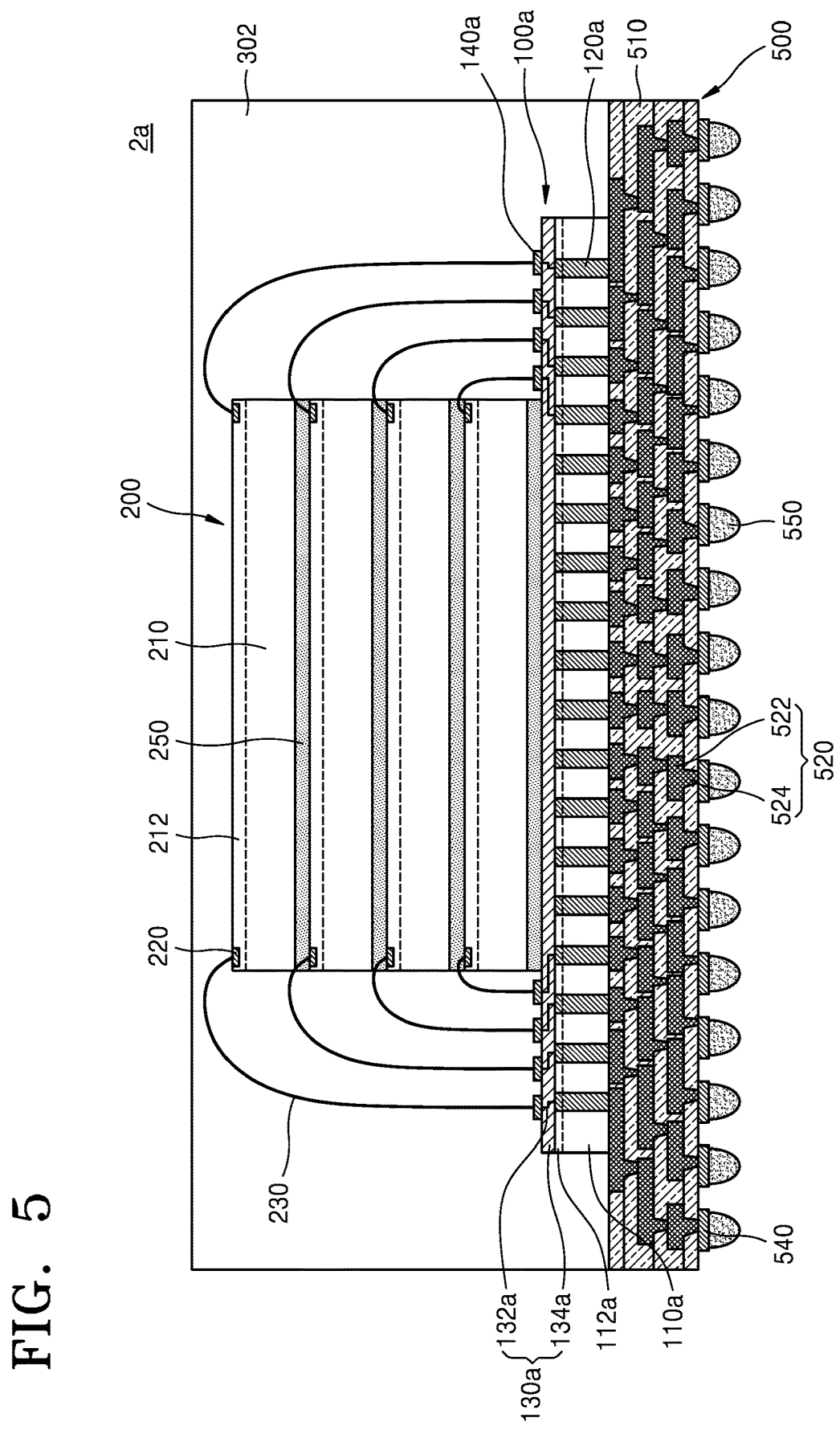

FIGS. 4 and 5 are cross-sectional views of semiconductor packages, according to example embodiments of the inventive concept.

Referring to FIG. 4, a semiconductor package 2 includes a redistribution structure 500, the first semiconductor chip 100 on the redistribution structure 500, and the plurality of second semiconductor chips 200 sequentially stacked on the first semiconductor chip 100. The first semiconductor chip 100 may further include the plurality of first chip connection pads 140 which are arranged on an upper surface thereof and connected to the plurality of through electrodes 120. The first chip connection pads 140 may each be referred to as a rear pad.

One end of each of the plurality of bonding wires 230 may be attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140, that is, the rear pad.

The redistribution structure 500 may include a redistribution insulating layer 510 and a redistribution conductive structure 520. In some embodiments, the redistribution structure 500 may include a plurality of stacked redistribution insulating layers 510. The redistribution insulating layers 510 may each be formed of, for example, photo imageable dielectric (PID) or photosensitive polyimide (PSPI). The redistribution conductive structure 520 may be formed of, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but is not limited thereto. In some embodiments, the redistribution conductive structure 520 may be formed by stacking a metal or an alloy of metals on a seed layer including titanium, titanium nitride, or titanium tungsten.

The redistribution conductive structure 520 may include a plurality of redistribution line patterns 522 arranged on at least one of upper and lower surfaces of the redistribution insulating layer 510, and a plurality of redistribution vias 524 that penetrate the redistribution insulating layer 510 to be connected to some of the plurality of redistribution line patterns 522. In some embodiments, at least some of the plurality of redistribution line patterns 522 may be formed together with some of the plurality of redistribution vias 524 to form one structure. For example, the redistribution line pattern 522 and the redistribution via 524 in contact with a lower surface of the redistribution line pattern 522 may be formed as one structure. For example, the redistribution line pattern 522 and the redistribution via 524 in contact with a lower surface of the redistribution line pattern 522 may be formed at the same time and of the same material.

In some embodiments, the plurality of redistribution vias 524 may each have a tapered shape extending from a lower side to an upper side with a horizontal width thereof increasing. For example, a horizontal width of each of the plurality of redistribution vias 524 is reduced as the plurality of redistribution vias 524 extend away from the semiconductor chip 100.

A plurality of external connection pads 540 electrically connected to the redistribution conductive structure 520 may be arranged on a lower surface of the redistribution structure 500, and a plurality of external connection terminals 550 may be attached to the plurality of external connection pads 540. In some embodiments, the external connection terminals 550 may each be formed as a solder ball.

The redistribution conductive structure 520 may electrically connect the plurality of conductive wiring patterns 132 to the plurality of external connection pads 540 to which the external connection terminals 550 are attached.

In some embodiments, a plurality of front pads similar to the plurality of front pads 142 illustrated in FIG. 1 may be between the wiring layer 130 of the first semiconductor chip 100 and the redistribution structure 500. Upper surfaces of the plurality of front pads may be connected to the conductive wiring patterns 132 of the wiring layer 130, and lower surfaces thereof may be connected to the redistribution conductive structures 520 of the redistribution structure 500.

The semiconductor package 2 may further include a molding layer 302 which is arranged on the redistribution structure 500, covers an upper surface of the first semiconductor chip 100, and surrounds the plurality of second semiconductor chips 200 and the plurality of bonding wires 230. The molding layer 302 may include, for example, an epoxy mold compound (EMC). In some embodiments, a horizontal width and a horizontal area of the molding layer 302 may have the same values as a horizontal width and a horizontal area of the redistribution structure 500. For example, a sidewall of the redistribution structure 500 may be aligned with a sidewall of the molding layer 302 in a vertical direction to form a coplanar surface.

Referring to FIG. 5, a semiconductor package 2a includes the redistribution structure 500, the first semiconductor chip 100a on the redistribution structure 500, and the plurality of second semiconductor chips 200 sequentially stacked on the first semiconductor chip 100a. The first semiconductor chip 100a may further include a plurality of first chip connection pads 140a which are arranged on an upper surface thereof and connected to the plurality of through electrodes 120a. The first chip connection pads 140a may each be referred to as a front pad.

One end of each of the plurality of bonding wires 230 is attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140a, that is, the front pad.

In some embodiments, a plurality of rear pads similar to the plurality of rear pads 144 illustrated in FIG. 2 may be between an inactive surface of the first semiconductor chip 100a and the redistribution structure 500. Upper surfaces of the plurality of rear pads may be connected to the plurality of through electrodes 120a, and lower surfaces thereof may be connected to the redistribution conductive structures 520 of the redistribution structure 500.

The semiconductor package 2a may further include a molding layer 302 that surrounds the first semiconductor chip 100a, the plurality of second semiconductor chips 200, and the plurality of bonding wires 230 on the redistribution structure 500.

FIGS. 6A to 6E are cross-sectional views sequentially illustrating a method of manufacturing a semiconductor package, according to example embodiments of the inventive concept. Specifically, FIGS. 6A to 6E are cross-sectional views sequentially illustrating a method of manufacturing the semiconductor package illustrated in FIG. 4.

Figure 6A:
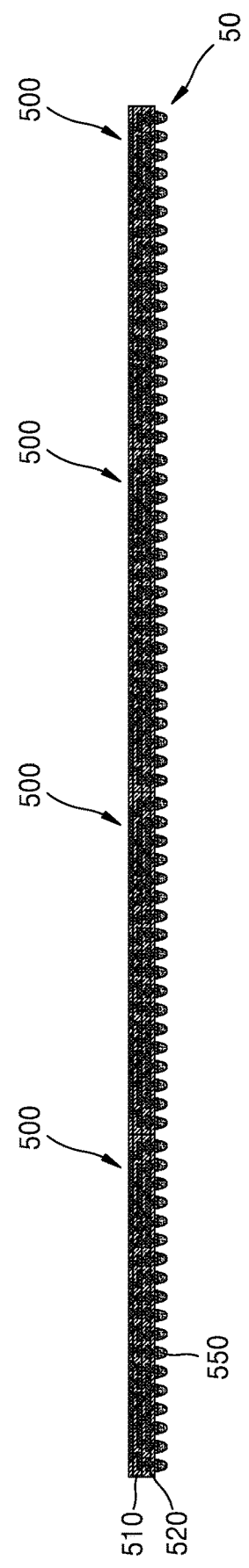
FIGS. 6A to 6E are cross-sectional views sequentially illustrating a method of manufacturing a semiconductor package, according to an example embodiment of the inventive concept.

Referring to FIG. 6A, a redistribution substrate 50 is prepared. The redistribution substrate 50 may include, for example, a plurality of redistribution structures 500 formed on a support substrate (not illustrated). In this case, the plurality of redistribution structures 500 included in the redistribution substrate 50 refer to portions to be separated and individualized into redistribution structures 500 afterwards. For example, the redistribution substrate 50 may be formed by repeatedly forming the redistribution insulating layer 510 and the redistribution conductive structure 520 on the support substrate one or more times.

In some embodiments, the plurality of external connection terminals 550 connected to the redistribution conductive structure 520 may be attached to a lower surface of the redistribution substrate 50. In some embodiments, the plurality of external connection terminals 550 may be attached to the lower surface of the redistribution substrate 50 before an individualization process illustrated in FIG. 6E is performed.

Figure 6B:
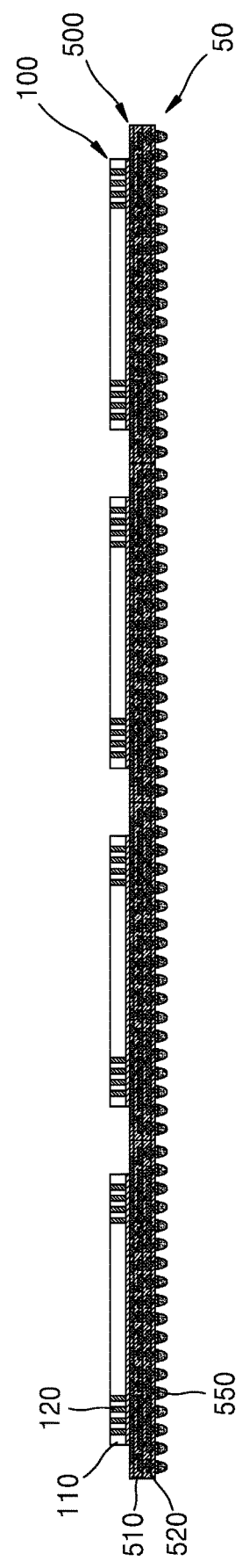

Referring to FIG. 6B, a plurality of first semiconductor chips 100 are attached onto the redistribution substrate 50. The plurality of first semiconductor chips 100 may be arranged to be spaced apart from each other on an upper surface of the redistribution substrate 50.

Figure 6C:
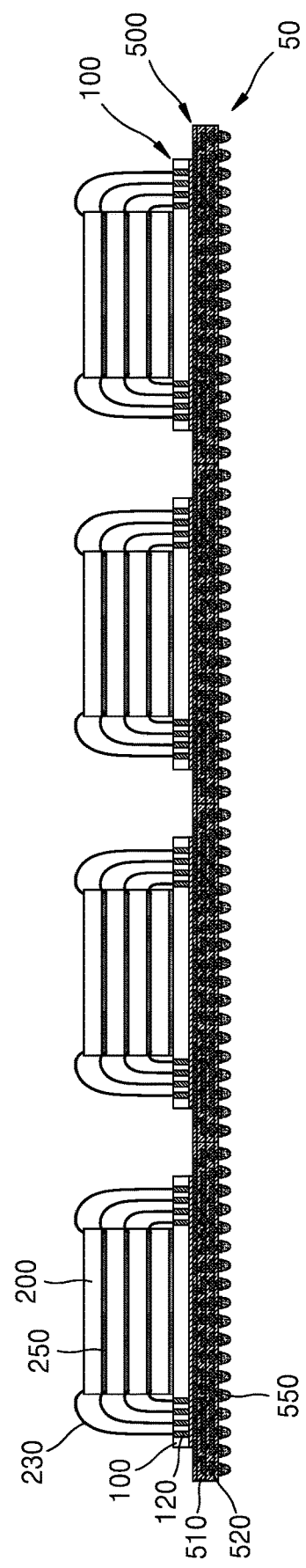

Referring to FIG. 6C, the plurality of second semiconductor chips 200 are stacked on the plurality of first semiconductor chips 100 to correspond to each of the plurality of first semiconductor chips 100. The plurality of second semiconductor chips 200 may be sequentially stacked on an inactive surface of the first semiconductor substrate 110 included in the base substrate 10 after the die adhesive films 250 are attached to lower surfaces of the plurality of second semiconductor chips 200. After the lowermost second semiconductor chip 200 corresponding to each of the plurality of first semiconductor chips 100 is attached on the base substrate 10, the bonding wires 230 are formed to connect the chip connection pads 220 of the lowermost second semiconductor chip 200 to the rear pads 144. Thereafter, another second semiconductor chip 200 is attached onto the lowermost second semiconductor chip 200, another second semiconductor chip 200 is attached onto the base substrate 10 to which the lowermost second semiconductor chip 200 is attached, and then a process of forming the bonding wires 230 connecting the chip connection pads 220 of the other second semiconductor chips 200 to the rear pads 144 may be repeatedly performed.

Figure 6D:
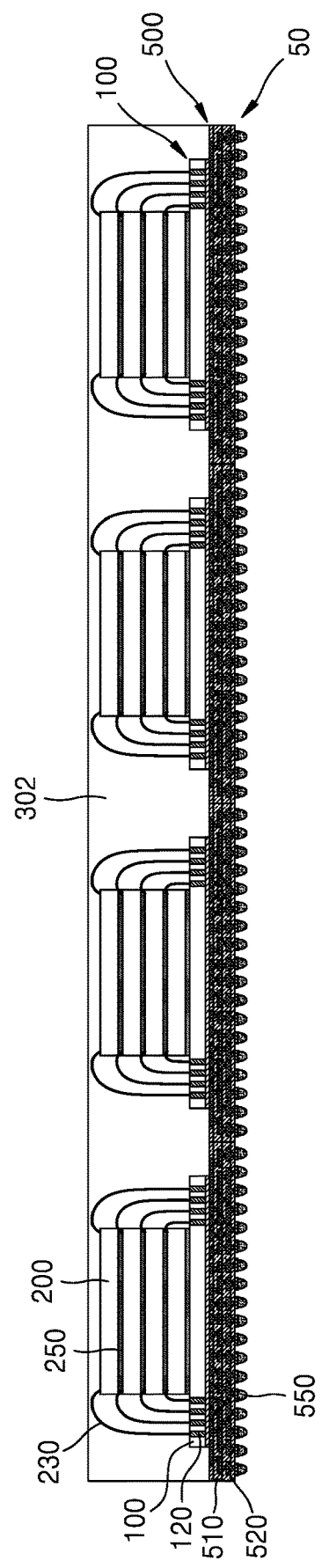
Figure 6E:
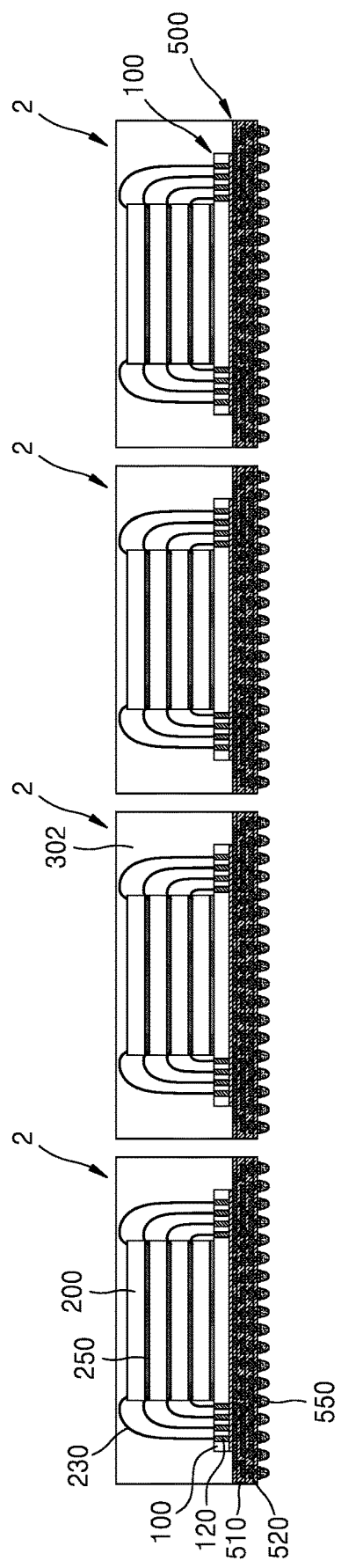

Referring to FIGS. 6D and 6E, the molding layer 302 is formed on the redistribution substrate 50 and surrounding the first semiconductor chip 100, the plurality of second semiconductor chips 200, and the plurality of bonding wires 230.

Thereafter, an individualization process of cutting the redistribution substrate 50 and the molding layer 300 is performed so that the redistribution substrate 50 is separated into redistribution structures 500, and accordingly, the plurality of semiconductor packages 2 may be formed.

The semiconductor package 2a illustrated in FIG. 5 may be formed by attaching the plurality of first semiconductor chips 100a onto the redistribution substrate 50 so that directions of an active surface and an inactive surface of the first semiconductor substrate 110a are opposite to directions of an active surface and an inactive surface of the first semiconductor substrate 110, by referring to the method of manufacturing the semiconductor package 2 described with reference to FIGS. 6A to 6E.

FIGS. 7 to 16 are cross-sectional views of semiconductor packages, according to example embodiments of the inventive concept.

Figure 7:
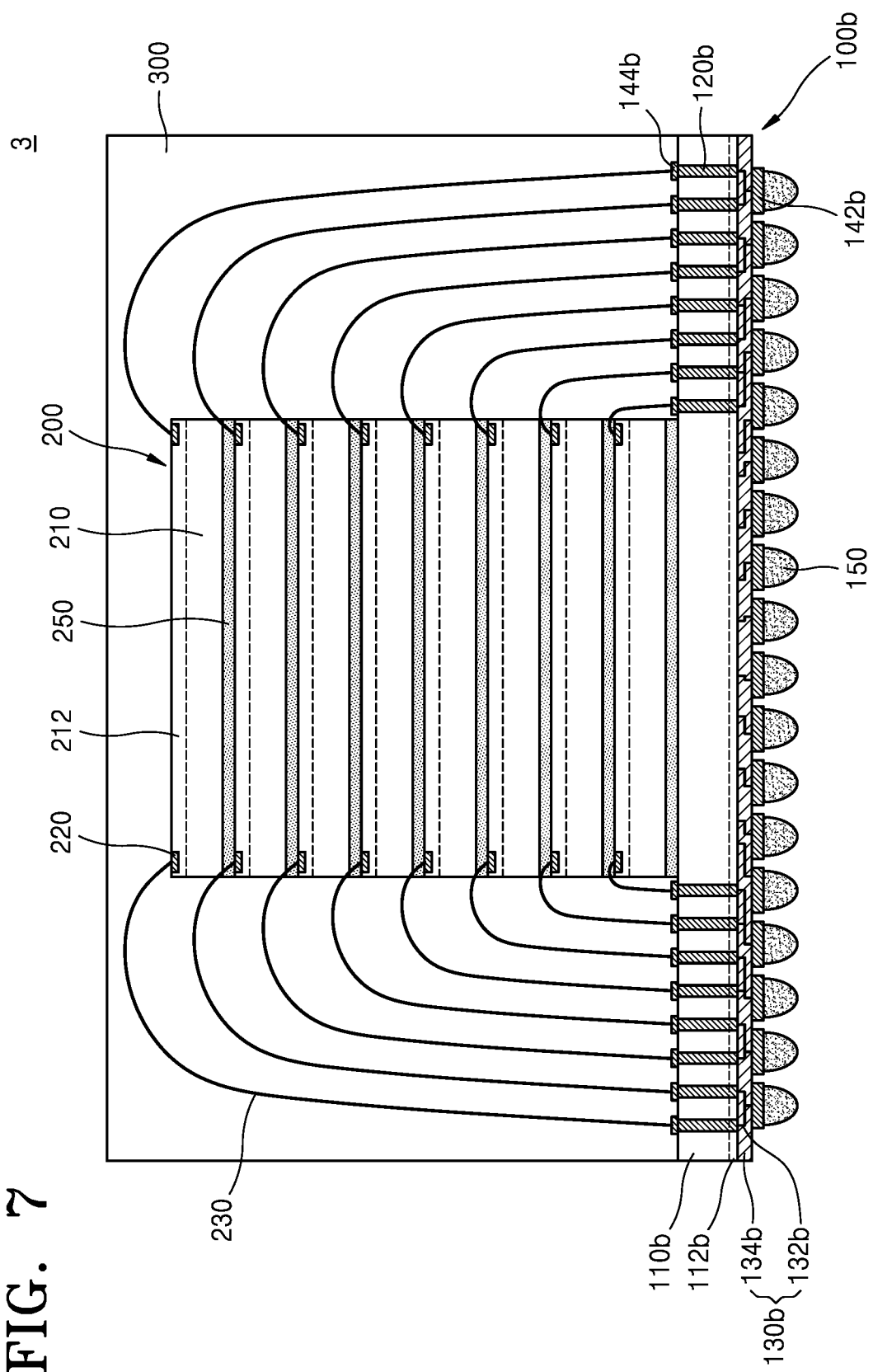
FIGS. 7 to 16 are cross-sectional views of semiconductor packages, according to example embodiments of the inventive concept.

Referring to FIG. 7, a semiconductor package 3 includes a first semiconductor chip 100b and a plurality of second semiconductor chips 200 sequentially stacked on the first semiconductor chip 100b. In some embodiments, each of the plurality of second semiconductor chips 200 may be a memory semiconductor chip including a memory device, and the first semiconductor chip 100b may be a logic semiconductor chip including circuits for controlling the memory device of each of the second semiconductor chips 200.

The first semiconductor chip 100b may include a first semiconductor substrate 110b having a first semiconductor device 112b formed in an active surface thereof, and a wiring layer 130b that is arranged on the active surface of the first semiconductor substrate 110b and includes a plurality of conductive wiring patterns 132b and an inter-wire insulating layer 134b. The first semiconductor chip 100b may further include a plurality of through electrodes 120b penetrating at least a portion between upper and lower surfaces of the first semiconductor chip 100b. The first semiconductor chip 100b may have a face-down arrangement in which the active surface of the first semiconductor substrate 110b faces downward. For example, the active surface of the first semiconductor substrate 110b may face away from the plurality of second semiconductor chips 200. The first semiconductor chip 100b may further include a plurality of front pads 142b which are arranged on a lower surface of the first semiconductor chip 100b and connected to the conductive wiring patterns 132b, and a plurality of rear pads 144b which are arranged on an upper surface of the first semiconductor chip 100b and connected to the plurality of through electrodes 120b.

The first semiconductor substrate 110b, the first semiconductor device 112b, the through electrodes 120b, the wiring layer 130b, the front pads 142b, and the rear pads 144b are substantially the same as the first semiconductor substrate 110, the first semiconductor device 112, the through electrodes 120, the wiring layer 130, the front pads 142, and the rear pads 144, respectively illustrated in FIG. 1, and thus, redundant descriptions thereof are omitted and a difference therebetween is mainly described.

The first semiconductor device 112b may include a circuit for changing a branch structure electrically connected to the plurality of second semiconductor chips 200. In some embodiments, the first semiconductor device 112b may include a serializer-deserializer (SerDes) circuit. For example, the first semiconductor device 112b may change two branches connected to two data pads of the second semiconductor chip 200 to be reduced to one, and the branch may reach the external connection terminal 150 attached to the front pad 142b.

Accordingly, according to a semiconductor package 3 of the inventive concept, a width of a data bus of the semiconductor package 3 may be determined by multiplying the number of second semiconductor chips 200 by a width of the data bus of each of the plurality of second semiconductor chips 200 and by a circuit that changes the number of electric paths of the first semiconductor device 112b. For example, in a case where the semiconductor package 3 includes four second semiconductor chips 200 and the width of the data bus of the second semiconductor chip 200 is 32 bits, when the first semiconductor device 112b changes two paths into one path, the width of the data bus of the first semiconductor package 3 may be 4×32/2 bits, that is, 64 bits.

Figure 8:
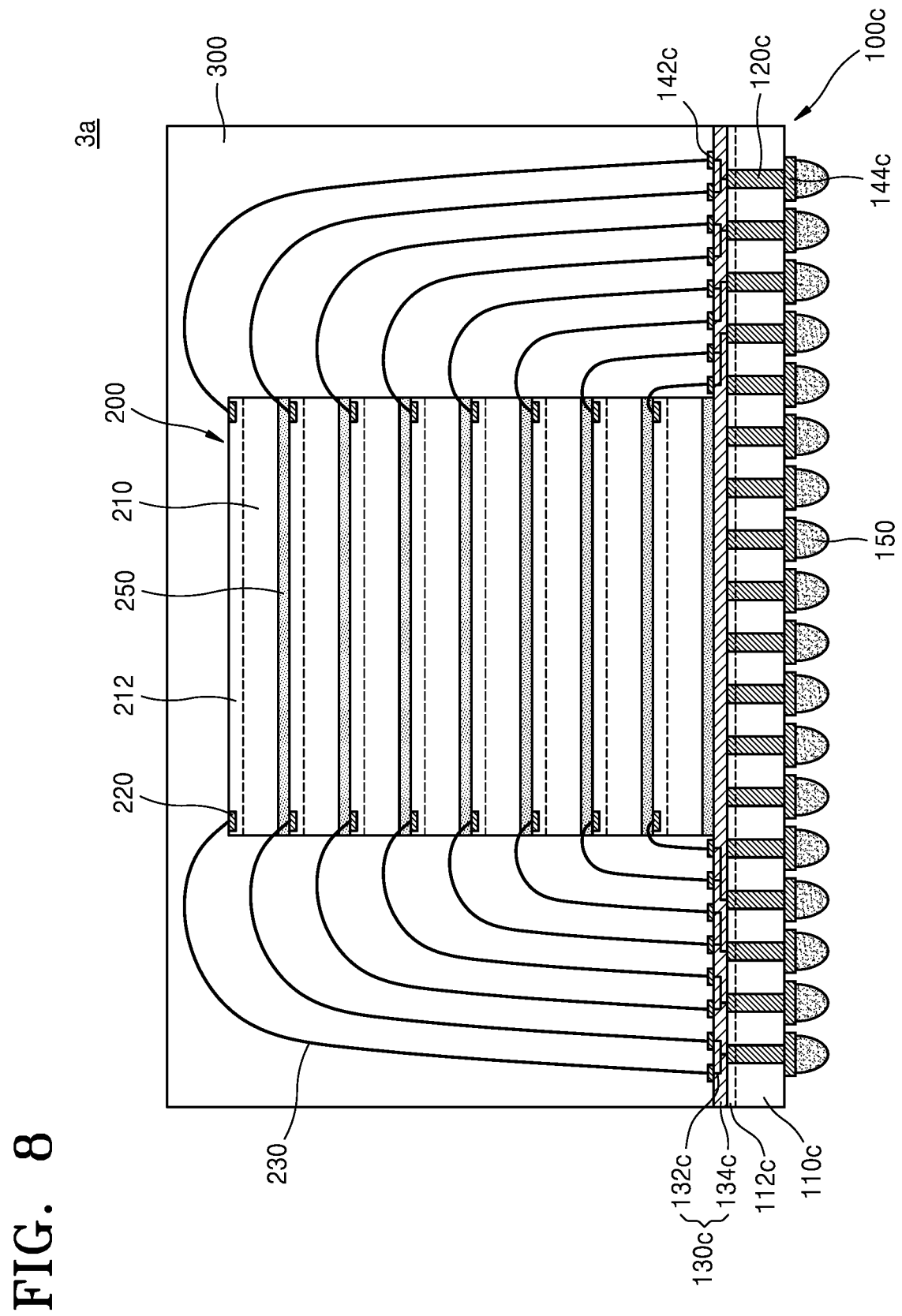

Referring to FIG. 8, a semiconductor package 3a includes a first semiconductor chip 100c and the plurality of second semiconductor chips 200 sequentially stacked on the first semiconductor chip 100c. In some embodiments, each of the plurality of second semiconductor chips 200 may be a memory semiconductor chip including a memory device, and the first semiconductor chip 100c may be a logic semiconductor chip including circuits for controlling the memory device of each of the second semiconductor chips 200.

The first semiconductor chip 100c may include a first semiconductor substrate 110c having a first semiconductor device 112c formed in an active surface thereof, and a wiring layer 130c which is arranged on the active surface of the first semiconductor substrate 110c and includes a plurality of conductive wiring patterns 132c and an inter-wire insulating layer 134c. The first semiconductor chip 100c may further include a plurality of through electrodes 120c penetrating at least a portion between upper and lower surfaces of the first semiconductor chip 100c. The first semiconductor chip 100c may have a face-up arrangement in which an active surface of the first semiconductor substrate 110b faces upward. For example, the active surface of the first semiconductor substrate 110b may face the plurality of second semiconductor chips 200. The first semiconductor chip 100c may further include a plurality of front pads 142c which are arranged on an upper surface of the first semiconductor chip 100c and connected to the conductive wiring patterns 132c, and a plurality of rear pads 144c which are arranged on a lower surface of the first semiconductor chip 100c and connected to the plurality of through electrodes 120c.

The first semiconductor substrate 110c, the first semiconductor device 112c, the through electrodes 120c, the wiring layer 130c, the front pads 142c, and the rear pads 144c are substantially the same as the first semiconductor substrate 110a, the first semiconductor device 112a, the through electrodes 120a, the wiring layer 130a, the front pads 142a, and the rear pads 144a respectively illustrated in FIG. 2, and thus, redundant descriptions thereof are omitted and a difference therebetween is mainly described.

Similar to the first semiconductor device 112b illustrated in FIG. 7, the first semiconductor device 112c may include a circuit for changing a branch structure electrically connected to the plurality of second semiconductor chips 200. In some embodiments, the first semiconductor device 112c may include a SerDes circuit. For example, the first semiconductor device 112c may change two branches connected to two data pads of the second semiconductor chip 200 to be reduced to one, and the branch may reach the external connection terminal 150 attached to the rear pad 144c.

Figure 9:
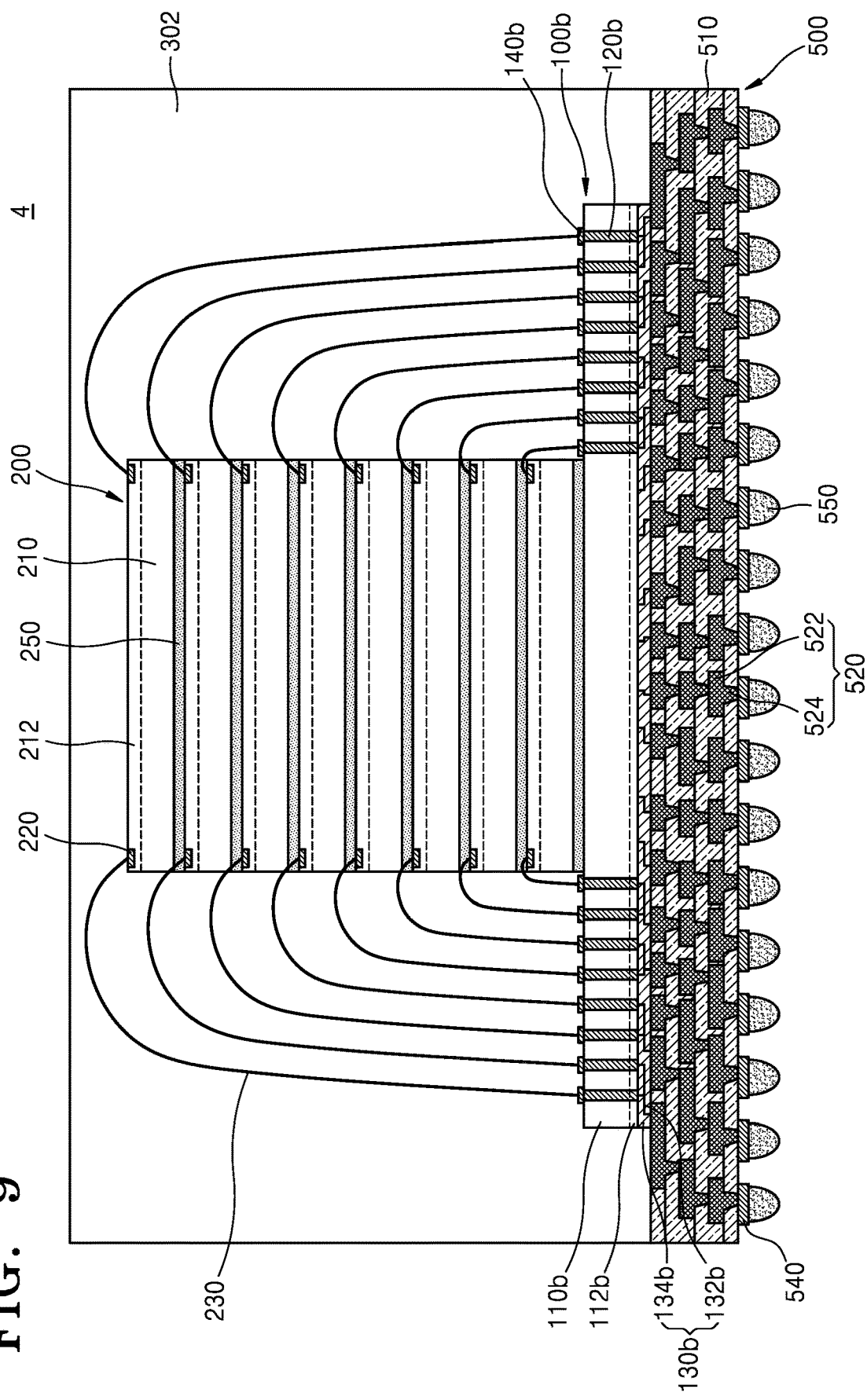

Referring to FIG. 9, a semiconductor package 4 includes the redistribution structure 500, the first semiconductor chip 100b on the redistribution structure 500, and the plurality of second semiconductor chips 200 sequentially stacked on the first semiconductor chip 100b. The first semiconductor chip 100b may further include a plurality of first chip connection pads 140b which are arranged on an upper surface of the first semiconductor chip 100b and connected to the plurality of through electrodes 120b. The plurality of first chip connection pad 140b may each be referred to as a rear pad.

One end of each of the plurality of bonding wires 230 is attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140b, that is, the rear pad.

The semiconductor package 4 may further include a molding layer 302 that surrounds the first semiconductor chip 100b, the plurality of second semiconductor chips 200, and the plurality of bonding wires 230 on the redistribution structure 500.

A difference between the semiconductor package 4 illustrated in FIG. 9 and the semiconductor package 3 illustrated in FIG. 7 is similar to a difference between the semiconductor package 2 illustrated in FIG. 4 and the semiconductor package 1 illustrated in FIG. 1, and thus, redundant descriptions thereof are omitted.

Figure 10:
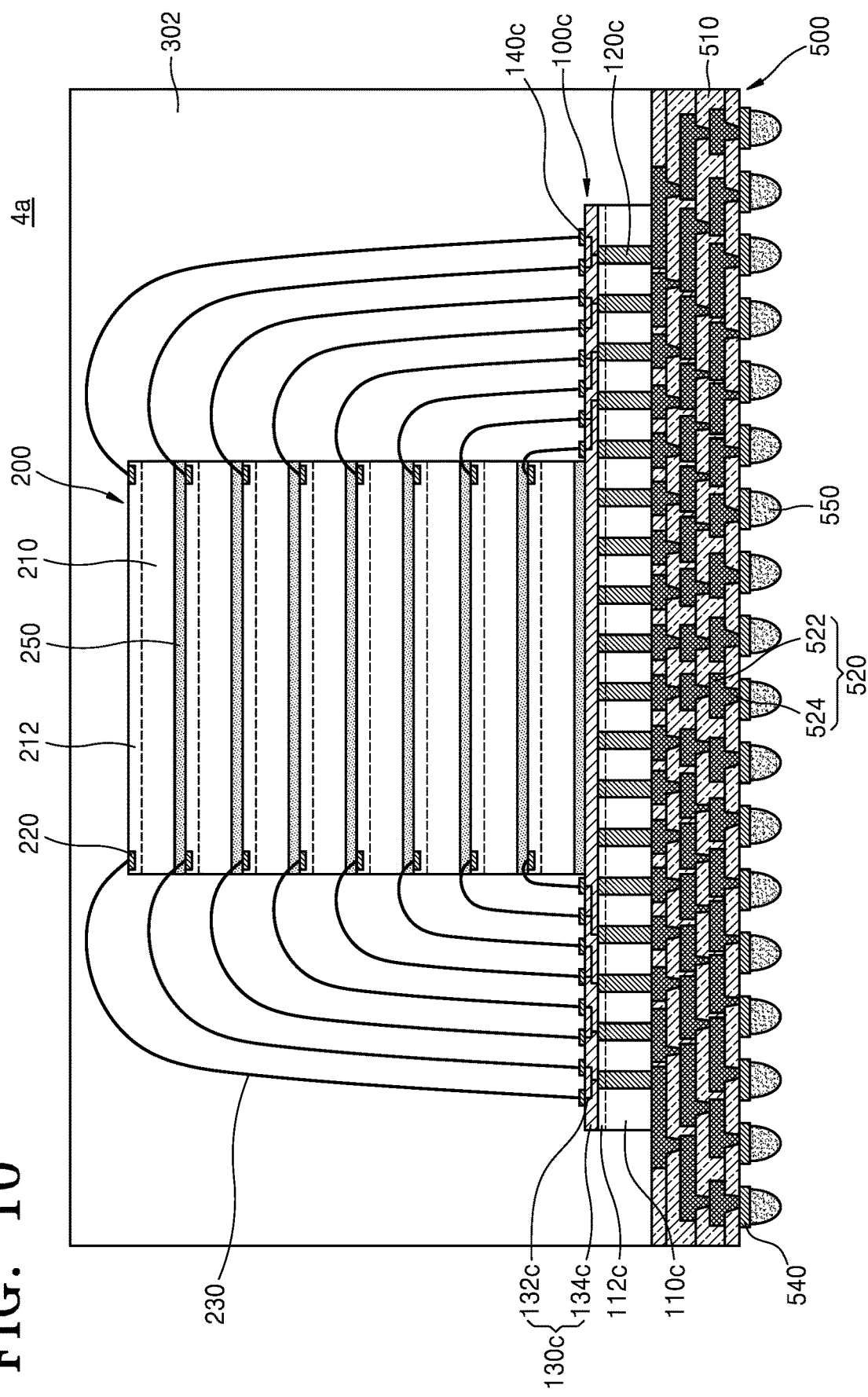

Referring to FIG. 10, a semiconductor package 4a includes the redistribution structure 500, the first semiconductor chip 100c on the redistribution structure 500, and the plurality of second semiconductor chips 200 sequentially stacked on the first semiconductor chip 100c. The first semiconductor chip 100c may further include a plurality of first chip connection pads 140c which are arranged on an upper surface of the first semiconductor chip 100c and connected to the plurality of through electrodes 120c. The first chip connection pads 140c may each be referred to as a front pad.

One end of each of the plurality of bonding wires 230 is attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140c, that is, the front pad.

The semiconductor package 4a may further include a molding layer 302 that surrounds the first semiconductor chip 100c, the plurality of second semiconductor chips 200, and the plurality of bonding wires 230 on the redistribution structure 500.

A difference between the semiconductor package 4a illustrated in FIG. 10 and the semiconductor package 3a illustrated in FIG. 8 is similar to a difference between the semiconductor package 2a illustrated in FIG. 5 and the semiconductor package 1a illustrated in FIG. 2, and thus, redundant descriptions thereof are omitted.

Figure 11:
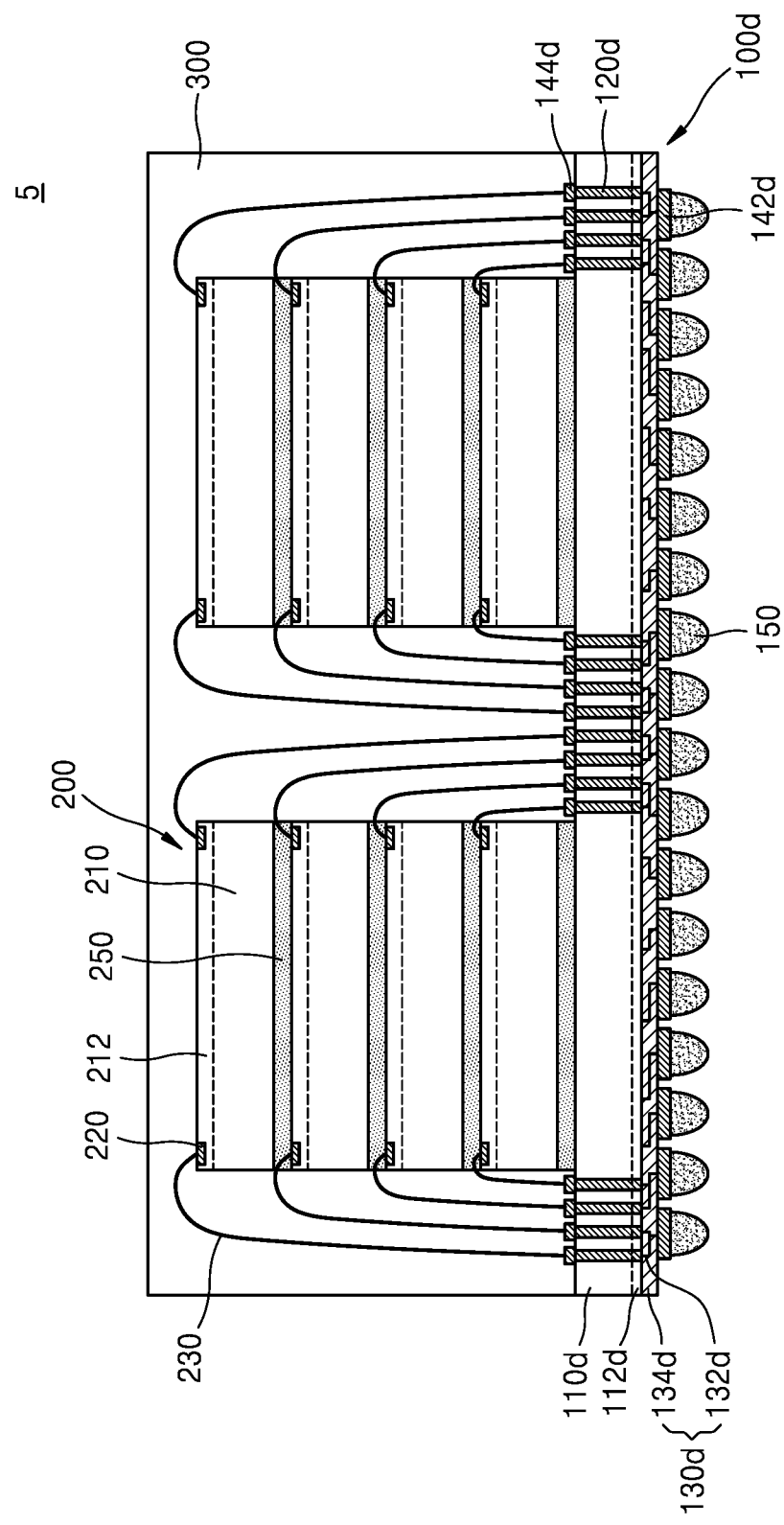

Referring to FIG. 11, a semiconductor package 5 includes a first semiconductor chip 100d and a plurality of second semiconductor chips 200 stacked on the first semiconductor chip 100d. In some embodiments, each of the plurality of second semiconductor chips 200 may be a memory semiconductor chip including a memory device, and the first semiconductor chip 100d may be a logic semiconductor chip including circuits for controlling the memory device of each of the second semiconductor chips 200.

The first semiconductor chip 100d may include a first semiconductor substrate 110d having a first semiconductor device 112d formed in an active surface thereof, and a wiring layer 130d that is arranged on the active surface of the first semiconductor substrate 110d and includes a plurality of conductive wiring patterns 132d and an inter-wire insulating layer 134d. The first semiconductor chip 100d may further include a plurality of through electrodes 120d penetrating at least a portion between the upper and lower surfaces of the first semiconductor chip 100d. The first semiconductor chip 100d includes a plurality of front pads 142d that are arranged on a lower surface of the first semiconductor chip 100d and connected to the conductive wiring patterns 132d, and a plurality of rear pads 144d that are arranged on an upper surface of the first semiconductor chip 100d and connected to the plurality of through electrodes 120d.

The first semiconductor substrate 110d, the first semiconductor device 112d, the through electrodes 120d, the wiring layer 130d, the front pads 142d, and the rear pads 144d are substantially the same as the first semiconductor substrate 110b, the first semiconductor device 112b, the through electrodes 120b, the wiring layer 130b, the front pads 142b, and the rear pads 144b illustrated in FIG. 7, and thus, redundant descriptions thereof are omitted and a difference therebetween is mainly described.

A first portion of the plurality of second semiconductor chips 200 may be sequentially stacked on the first semiconductor chip 100d, and a second portion of the plurality of second semiconductor chips 200 may be sequentially stacked on the first semiconductor chip 100d to be spaced apart in the horizontal direction from the first portion of the second semiconductor chips 200.

The number of second semiconductor chips 200 included in the semiconductor package 3 illustrated in FIG. 7 is equal to the number of second semiconductor chips 200 included in the semiconductor package 4a illustrated in FIG. 10, but the number of second semiconductor chips 200 vertically stacked on the first semiconductor chip 100b included in the semiconductor package 3 illustrated in FIG. 7 is different from the number of second semiconductor chips 200 vertically stacked on the first semiconductor chip 100d included in the semiconductor package 4a illustrated in FIG. 10.

For example, the semiconductor package 3 illustrated in FIG. 7 may have one stack structure in which eight second semiconductor chips 200 are stacked on a first semiconductor chip 100b, and the semiconductor package 5 illustrated in FIG. 11 may have two stack structures, each of which include four second semiconductor chips 200 stacked on the first semiconductor chip 100d.

For example, the semiconductor package 5 illustrated in FIG. 11 may have substantially the same operating characteristics as the semiconductor package 3 illustrated in FIG. 7 but may have a relatively smaller size in a vertical direction, that is, a relatively smaller vertical height and may have a relatively larger width in a horizontal direction and relatively larger horizontal area, compared to the semiconductor package 3 illustrated in FIG. 7.

Figure 12:
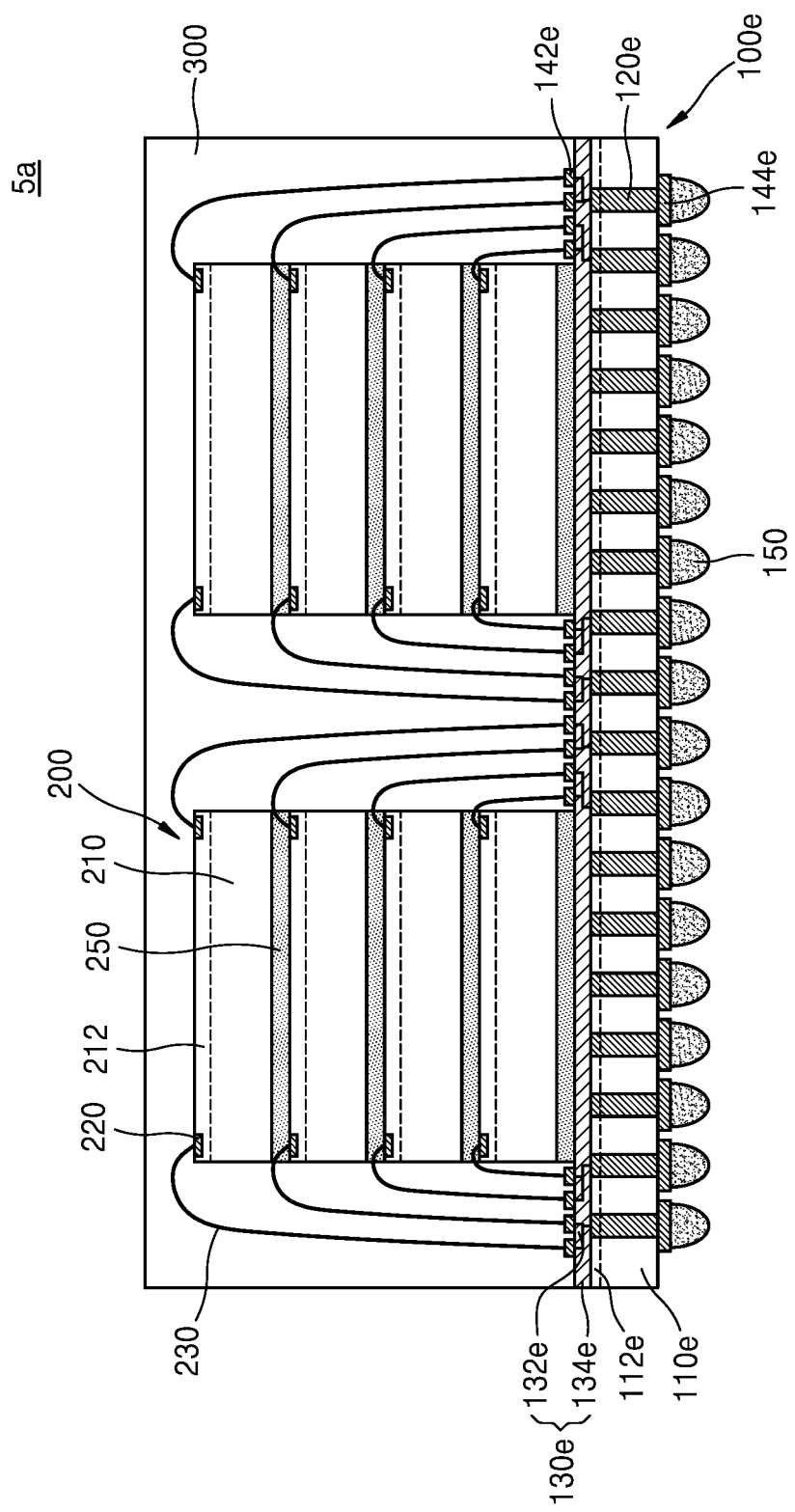

Referring to FIG. 12, a semiconductor package 5a includes a first semiconductor chip 100e and the plurality of second semiconductor chips 200 stacked on the first semiconductor chip 100e. In some embodiments, each of the plurality of second semiconductor chips 200 may be a memory semiconductor chip including a memory device, and the first semiconductor chip 100e may be a logic semiconductor chip including circuits for controlling the memory device of each of the second semiconductor chips 200.

The first semiconductor chip 100e may include a first semiconductor substrate 110e having a first semiconductor device 112e formed in an active surface thereof, and a wiring layer 130e that is arranged on the active surface of the first semiconductor substrate 110e and includes a plurality of conductive wiring patterns 132e and an inter-wire insulating layer 134e. The first semiconductor chip 100e may further include a plurality of through electrodes 120e penetrating at least a portion between upper and lower surfaces of the first semiconductor chip 100e. The first semiconductor chip 100e may further include a plurality of front pads 142e that are arranged on an upper surface of the first semiconductor chip 100e and connected to the conductive wiring patterns 132e, and a plurality of rear pads 144e that are arranged on a lower surface of the first semiconductor chip 100e and connected to the plurality of through electrodes 120e.

The first semiconductor substrate 110e, the first semiconductor device 112e, the through electrodes 120e, the wiring layer 130e, the front pads 142e, and the rear pads 144e are substantially the same as the first semiconductor substrate 110c, the first semiconductor device 112c, the through electrodes 120c, the wiring layer 130c, the front pads 142c, and the rear pads 144c, respectively illustrated in FIG. 8, and thus, redundant descriptions thereof are omitted and a difference therebetween is mainly described.

A first portion of the plurality of second semiconductor chips 200 may be sequentially stacked on the first semiconductor chip 100e, and a second portion of the plurality of second semiconductor chips 200 may be sequentially stacked on the first semiconductor chip 100e to be spaced apart in the horizontal direction from the first portion of the second semiconductor chips 200.

A difference between the semiconductor package 5a illustrated in FIG. 12 and the semiconductor package 3a illustrated in FIG. 8 is similar to a difference between the semiconductor package 5 illustrated in FIG. 11 and the semiconductor package 3 illustrated in FIG. 7, and thus, description thereof will not be repeated.

For example, the semiconductor package 5a illustrated in FIG. 12 may have substantially the same operating characteristics as the semiconductor package 3a illustrated in FIG. 8, but may have a relatively smaller size in a vertical direction, that is, a relatively smaller vertical height and may have a relatively larger width in a horizontal direction and relatively larger horizontal area, compared to the semiconductor package 3a illustrated in FIG. 8.

Figure 13:
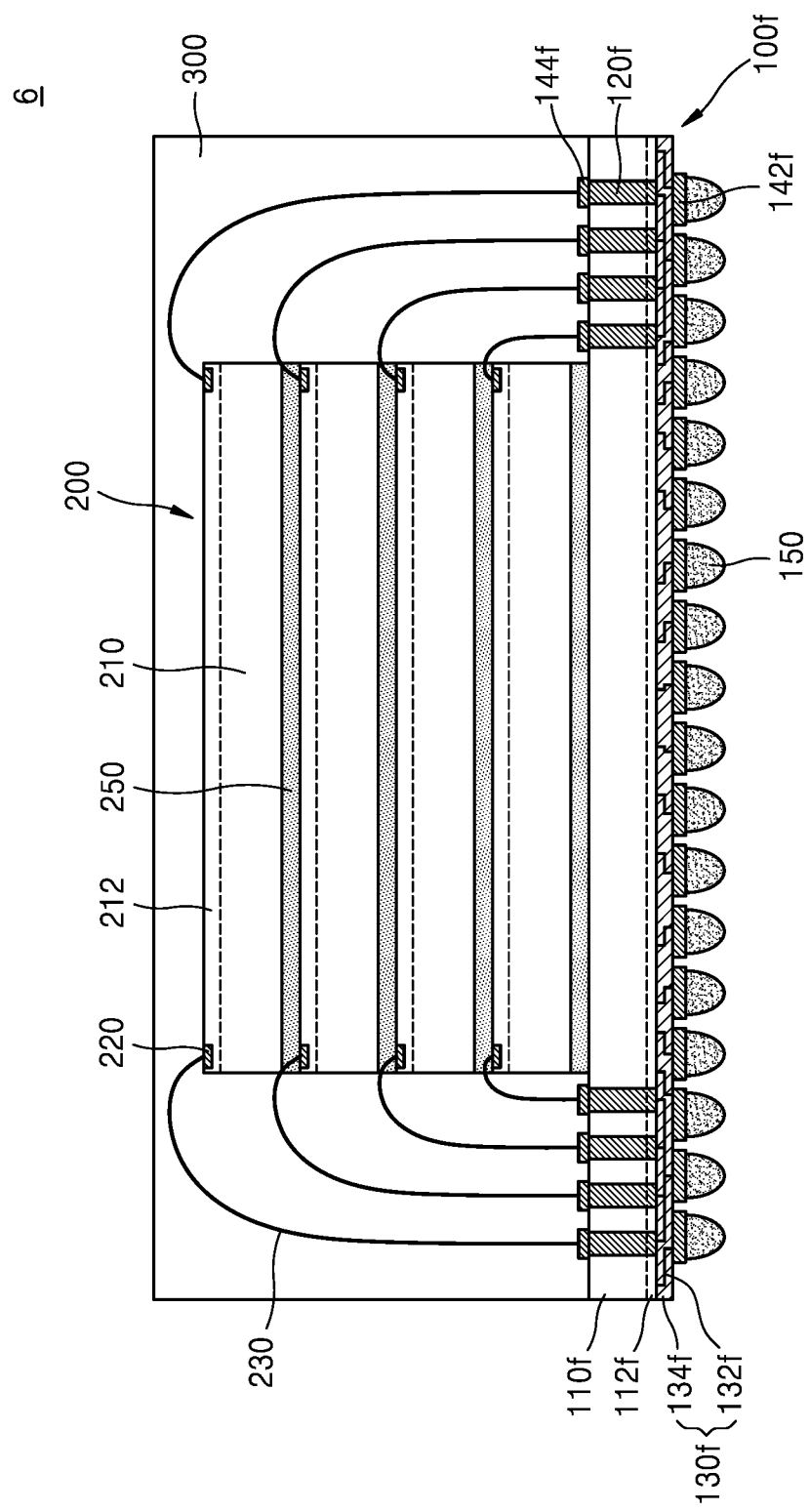

Referring to FIG. 13, a semiconductor package 6 includes a first semiconductor chip 100f and the plurality of second semiconductor chips 200 sequentially stacked on the first semiconductor chip 100f. In some embodiments, each of the plurality of second semiconductor chips 200 may be a memory semiconductor chip including a memory device, and the first semiconductor chip 100f may be a logic semiconductor chip including circuits for controlling the memory device of each of the second semiconductor chips 200.

The first semiconductor chip 100f may include a first semiconductor substrate 110f having a first semiconductor device 112f formed in an active surface thereof, and a wiring layer 130f which is arranged on the active surface of the first semiconductor substrate 110f and includes a plurality of conductive wiring patterns 132f and an inter-wire insulating layer 134f. The first semiconductor chip 100f may further include a plurality of through electrodes 120f penetrating at least a portion between upper and lower surfaces of the first semiconductor chip 100f. The first semiconductor chip 100f may include a plurality of front pads 142f that are arranged on a lower surface of the first semiconductor chip 100f and connected to the conductive wiring patterns 132f, and a plurality of rear pads 144f that are arranged on the upper surface of the first semiconductor chip 100f and connected to the plurality of through electrodes 120f.

The first semiconductor substrate 110f, the first semiconductor device 112f, the through electrodes 120f, the wiring layer 130f, the front pad 142f, and the rear pad 144f are substantially the same as the first semiconductor substrate 110b, the first semiconductor device 112b, the through electrodes 120b, the wiring layer 130b, the front pad 142b, and the rear pad 144b, respectively, and thus, redundant description thereof will be omitted and a difference therebetween is mainly described.

The first semiconductor device 112f may include a circuit for changing a branch structure electrically connected to the plurality of second semiconductor chips 200. In some embodiments, the first semiconductor device 112f may include a SerDes circuit. For example, the first semiconductor device 112f may change four branches connected to four data pads of the second semiconductor chip 200 to be reduced to one, and the branch may reach the external connection terminal 150 attached to the front pad 142f. For example, a width of a data bus of the semiconductor package 6 may be 16 to 64 bits.

Accordingly, according to a semiconductor package 6 of the inventive concept, the width of the data bus of the semiconductor package 6 may be determined by multiplying the number of second semiconductor chips 200 by a width of the data bus of each of the plurality of second semiconductor chips 200 and by a circuit that changes the number of electric paths of the first semiconductor device 112f. For example, in a case where the semiconductor package 6 includes four second semiconductor chips 200 and the width of the data bus of the second semiconductor chip 200 is 32 bits, when the first semiconductor device 112f changes four paths into one path, the width of the data bus of the first semiconductor package 6 may be 4×32/4 bits, that is, 32 bits.

Figure 14:
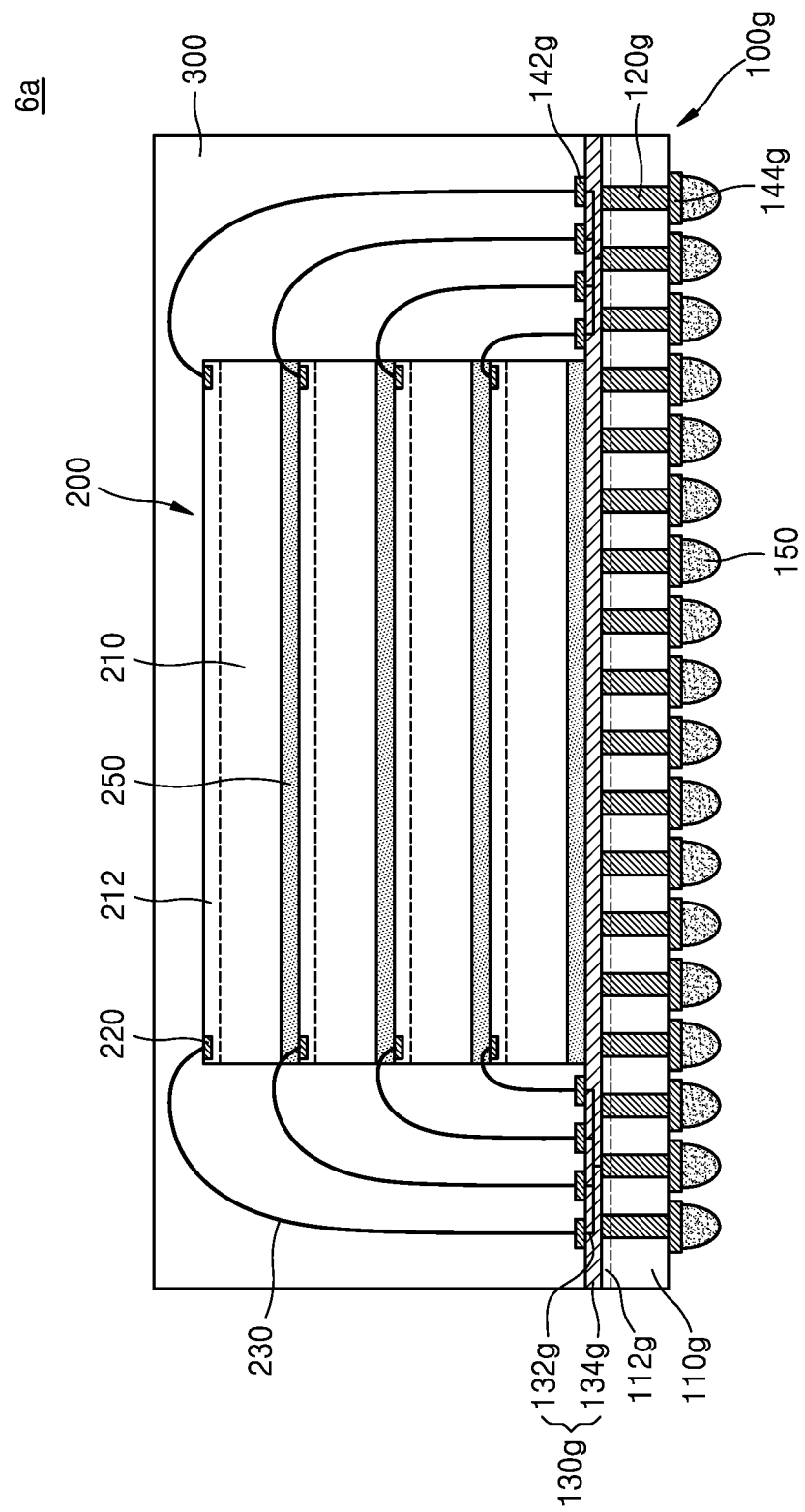

Referring to FIG. 14, a semiconductor package 6a includes a first semiconductor chip 100g and the plurality of second semiconductor chips 200 sequentially stacked on the first semiconductor chip 100g. In some embodiments, each of the plurality of second semiconductor chips 200 may be a memory semiconductor chip including a memory device, and the first semiconductor chip 100g may be a logic semiconductor chip including circuits for controlling the memory device of each of the second semiconductor chips 200.

The first semiconductor chip 100g may include a first semiconductor substrate 110g having a first semiconductor device 112f formed in an active surface thereof, and a wiring layer 130g which is arranged on the active surface of the first semiconductor substrate 110g and includes a plurality of conductive wiring patterns 132g and an inter-wire insulating layer 134g. The first semiconductor chip 100g may further include a plurality of through electrodes 120g penetrating at least a portion between upper and lower surfaces of the first semiconductor chip 100g. The first semiconductor chip 100g may include a plurality of front pads 142g that are arranged on a lower surface of the first semiconductor chip 100g and connected to the conductive wiring patterns 132g, and a plurality of rear pads 144g that are arranged on the upper surface of the first semiconductor chip 100g and connected to the plurality of through electrodes 120g.

The first semiconductor substrate 110g, the first semiconductor device 112g, the through electrodes 120g, the wiring layer 130g, the front pads 142g, and the rear pads 144g are substantially the same as the first semiconductor substrate 110c, the first semiconductor device 112c, the through electrodes 120c, the wiring layer 130c, the front pads 142c, and the rear pads 144c, respectively illustrated in FIG. 8, and thus, redundant descriptions thereof are omitted and a difference therebetween is mainly described.

Similar to the first semiconductor device 112f illustrated in FIG. 13, the first semiconductor device 112g may include a circuit for changing a branch structure electrically connected to the plurality of second semiconductor chips 200. In some embodiments, the first semiconductor device 112g may include a SerDes circuit. For example, the first semiconductor device 112g may change four branches connected to four data pads of the second semiconductor chip 200 to be reduced to one, and the branch may reach the external connection terminal 150 attached to the front pad 142g.

Figure 15:
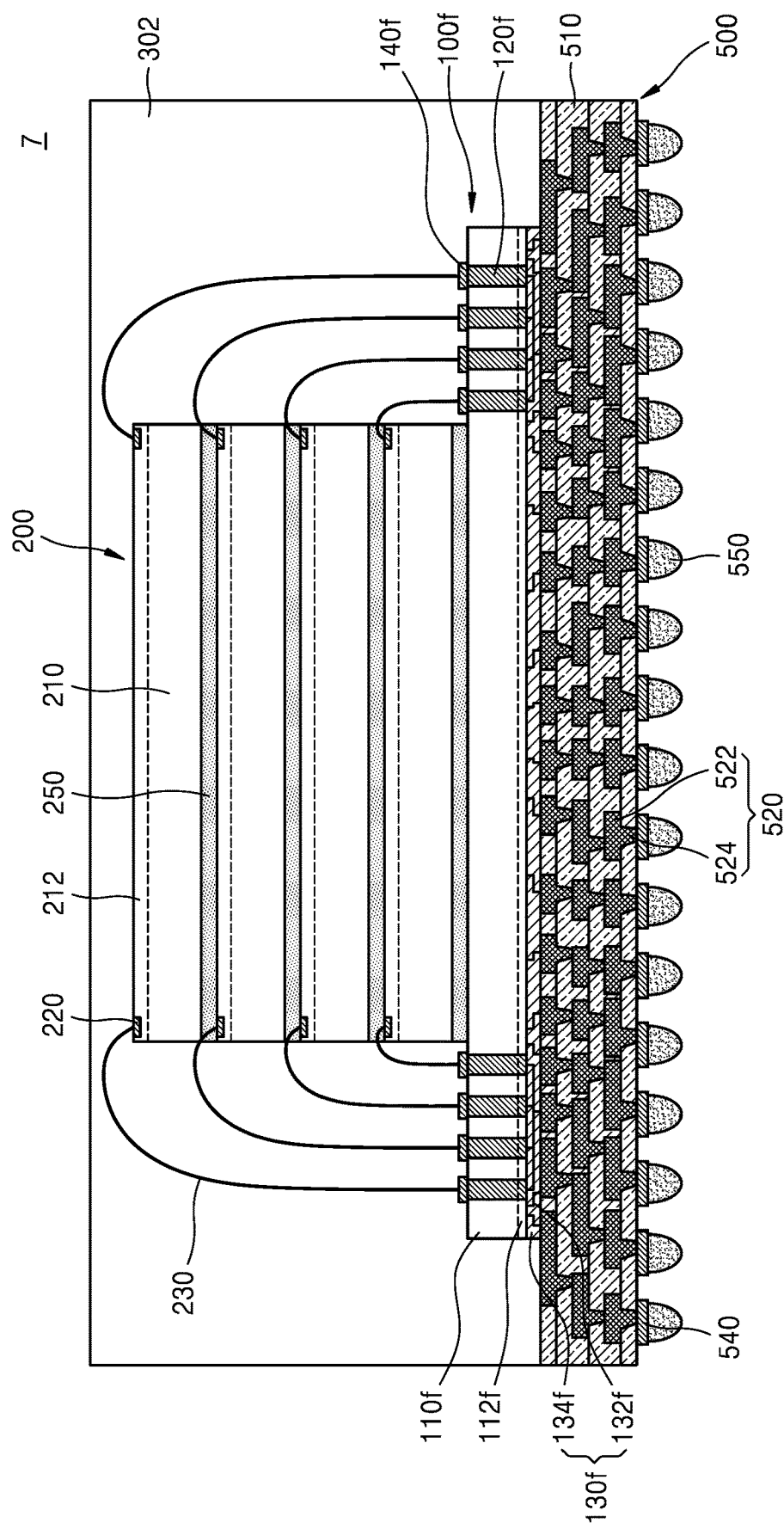

Referring to FIG. 15, a semiconductor package 7 includes the redistribution structure 500, the first semiconductor chip 100f on the redistribution structure 500, and the plurality of second semiconductor chips 200 sequentially stacked on the first semiconductor chip 100f. The first semiconductor chip 100f may further include a plurality of first chip connection pads 140f arranged on an upper surface of the first semiconductor chip 100f and connected to the plurality of through electrodes 120f. The first chip connection pads 140f may each be referred to as a rear pad.

One end of each of the plurality of bonding wires 230 may be attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140f, that is, the rear pad.

The semiconductor package 7 may further include a molding layer 302 that surrounds the first semiconductor chip 100f, the plurality of second semiconductor chips 200, and the plurality of bonding wires 230 on the redistribution structure 500.

A difference between the semiconductor package 7 illustrated in FIG. 15 and the semiconductor package 5 illustrated in FIG. 11 is similar to a difference between the semiconductor package 2 illustrated in FIG. 4 and the semiconductor package 1 illustrated in FIG. 1, and thus, redundant descriptions thereof are omitted.

Figure 16:
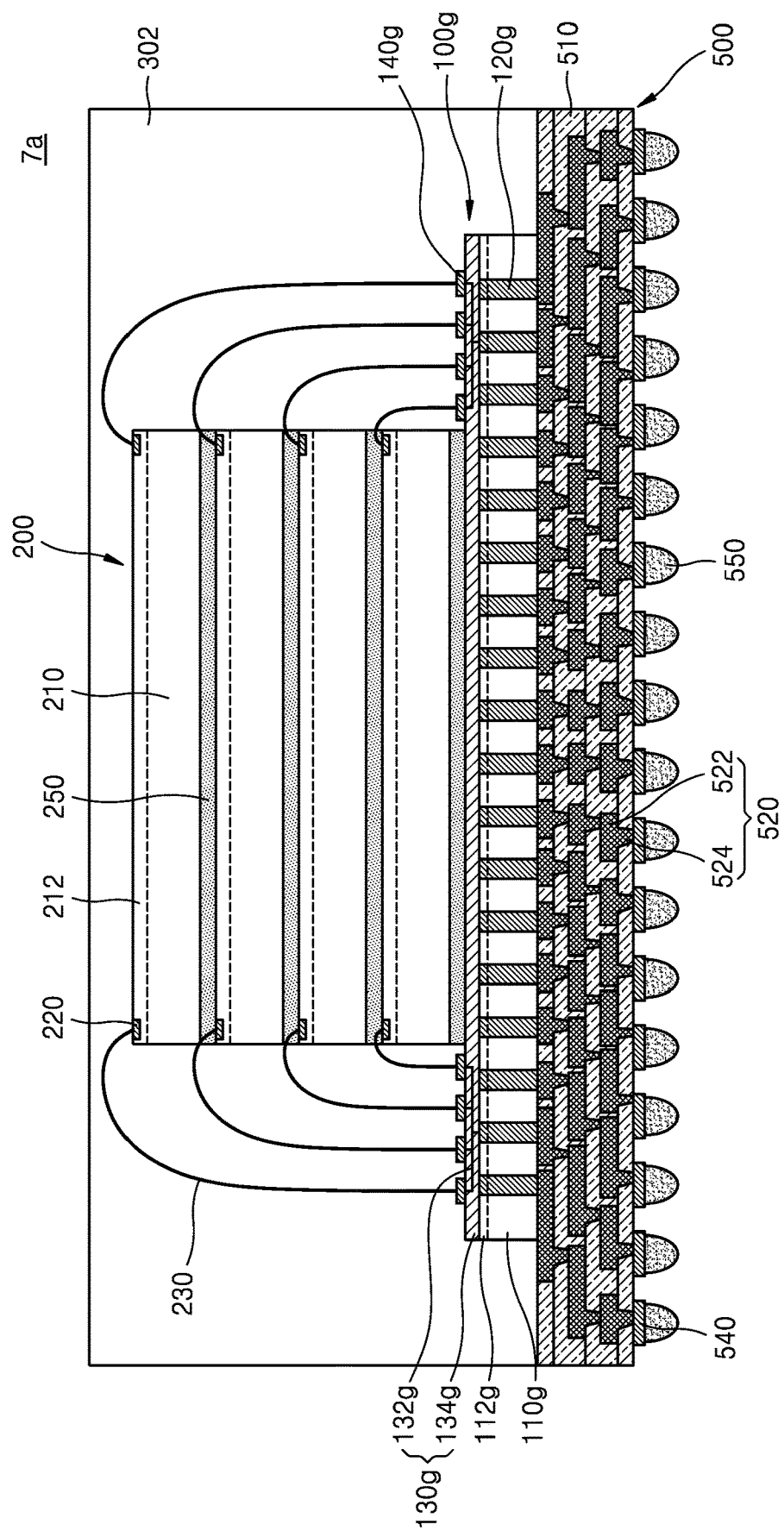

Referring to FIG. 16, a semiconductor package 7a includes the redistribution structure 500, the first semiconductor chip 100g on the redistribution structure 500, and the plurality of second semiconductor chips 200 sequentially stacked on the first semiconductor chip 100g. The first semiconductor chip 100g may further include a plurality of first chip connection pads 140g which are arranged on an upper surface of the first semiconductor chip 100g and connected to the plurality of through electrodes 120g. The first chip connection pads 140g may each be referred to as a front pad.

One end of each of the plurality of bonding wires 230 may be attached to a corresponding one of the chip connection pads 220 of the plurality of second semiconductor chips 200, that is, each of the second chip connection pads 220, and the other end of each of the plurality of bonding wires 230 may be attached to a corresponding one of the plurality of first chip connection pads 140f, that is, the front pad.

The semiconductor package 7a may further include a molding layer 302 that surrounds the first semiconductor chip 100g, the plurality of second semiconductor chips 200, and the plurality of bonding wires 230 on the redistribution structure 500.

A difference between the semiconductor package 7a illustrated in FIG. 16 and the semiconductor package 5a illustrated in FIG. 12 is similar to a difference between the semiconductor package 2a illustrated in FIG. 5 and the semiconductor package 1a illustrated in FIG. 2, and thus, redundant descriptions thereof are omitted.

Figure 17A:
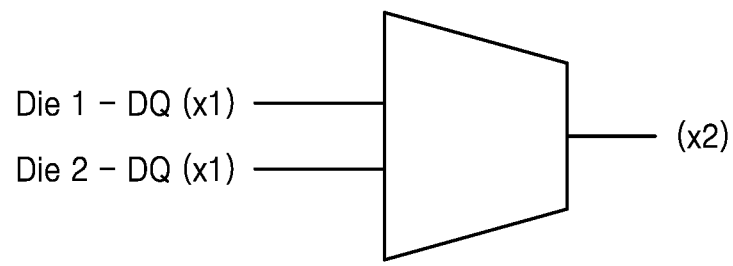
FIGS. 17A and 17B are circuit diagrams illustrating examples of a first semiconductor chip included in a semiconductor package, according to an embodiment of the inventive concept.
Figure 17B:
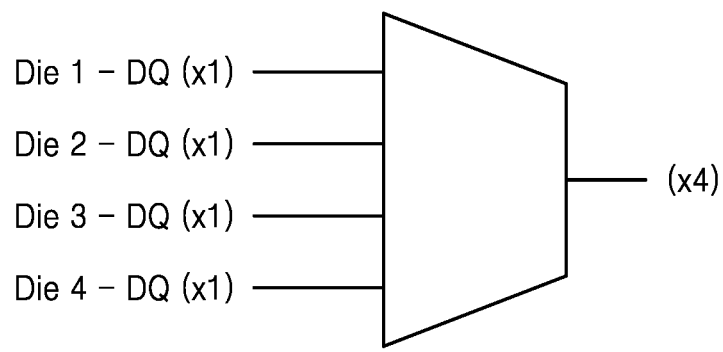

FIGS. 17A and 17B are circuit diagrams illustrating an example circuit of a first semiconductor device of a first semiconductor chip included in a semiconductor package, according to example embodiments.

Referring to FIGS. 17A and 17B, the first semiconductor device of the first semiconductor chip included in the semiconductor package may include a SerDes circuit. The circuit illustrated in FIG. 17A is a SerDes circuit included in the first semiconductor device 112b illustrated in FIGS. 7 and 9, the semiconductor device 112c illustrated in FIGS. 8 and 10, the semiconductor device 112d illustrated in FIG. 11, or the semiconductor device 112e illustrated in FIG. 12, and the circuit illustrated in FIG. 17B is a SerDes circuit included in the first semiconductor device 112f illustrated in FIGS. 13 and 15 or the semiconductor device 112g illustrated in FIGS. 14 and 16.

Referring to FIG. 17A, the SerDes circuit may receive in parallel signals (1×) of data DQ of two dies (Die1 and Die2), that is, two different second semiconductor chips 200 of the plurality of second semiconductor chips 200 illustrated in FIGS. 7 to 12 and output two data signals (2×) in series. Accordingly, two branches connected to two data pads of each of the second semiconductor chips 200 illustrated in FIGS. 7 to 12 may be changed to one branch to be transmitted to the external connection terminals 150 and 550.

Referring to FIG. 17B, the SerDes circuit may receive in parallel signals (1×) of the data DQ of four dies (Die1, Die2, Die3, and Die4), that is, four different second semiconductor chips 200 of the plurality of second semiconductor chips 200 illustrated in FIGS. 13 to 16 and output two data signals (4×) in series. Accordingly, four branches connected to four data pads of each of the second semiconductor chips 200 illustrated in FIGS. 13 to 16 may be changed to one branch to be transmitted to the external connection terminals 150 and 550.

FIGS. 18 to 21 are cross-sectional views of semiconductor packages, according to example embodiments of the inventive concept.

Figure 18:
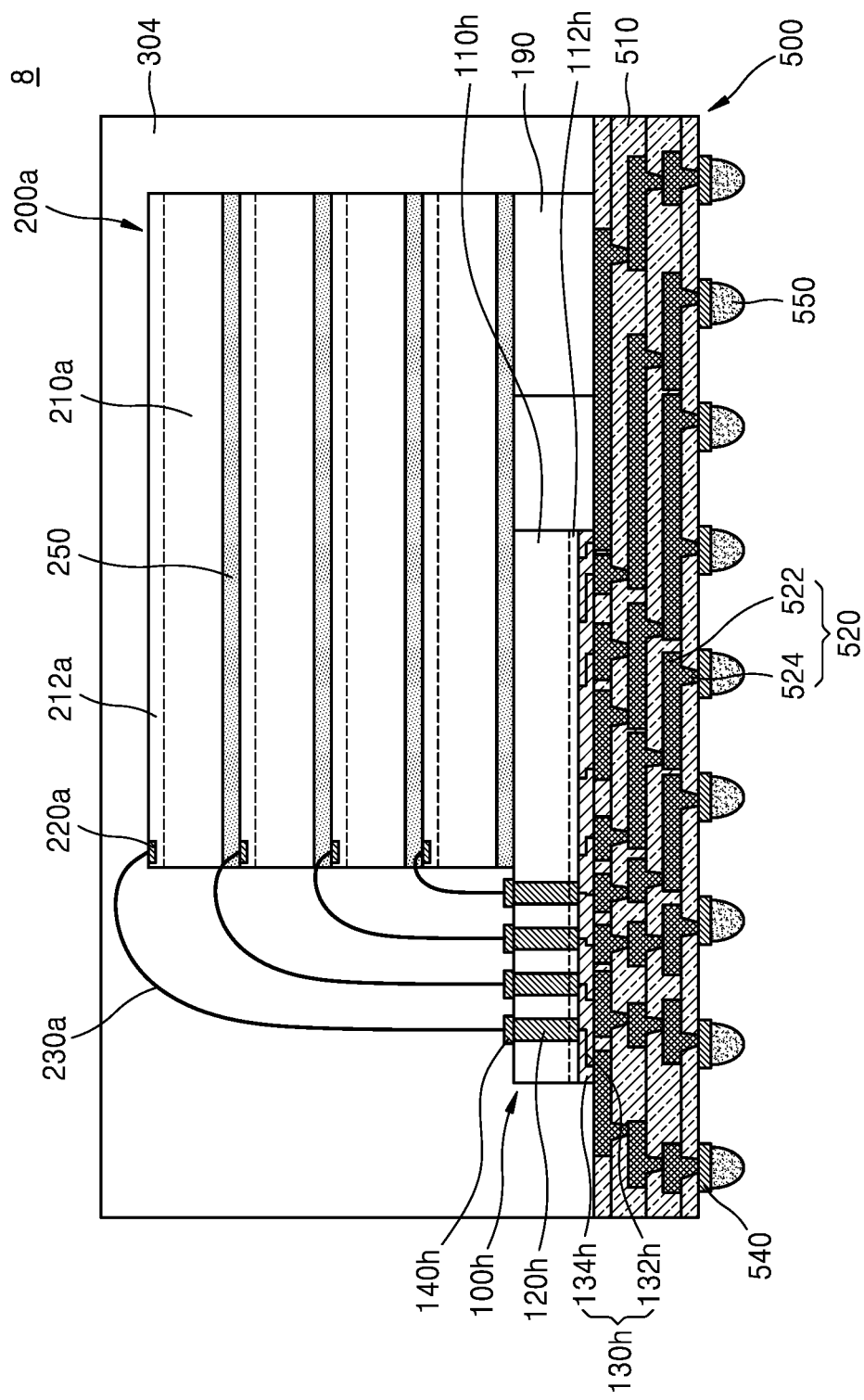
FIGS. 18 to 21 are cross-sectional views of semiconductor packages, according to example embodiments of the inventive concept.

Referring to FIG. 18, a semiconductor package 8 includes the redistribution structure 500, a first semiconductor chip 100h on the redistribution structure 500, and a plurality of second semiconductor chips 200a sequentially stacked on the first semiconductor chip 100h. In some embodiments, each of the plurality of second semiconductor chips 200a may be a memory semiconductor chip including a memory device, and the first semiconductor chip 100h may be a logic semiconductor chip including circuits for controlling the memory device of each of the second semiconductor chips 200a.

The first semiconductor chip 100h may include a first semiconductor substrate 110h having a first semiconductor device 112h formed in an active surface thereof, and a wiring layer 130h which is arranged on the active surface of the first semiconductor substrate 110h and includes a plurality of conductive wiring patterns 132h and an inter-wire insulating layer 134h. The first semiconductor chip 100h may further include a plurality of through electrodes 120h penetrating at least a portion between upper and lower surfaces of the first semiconductor chip 100h. The first semiconductor chip 100h may further include a plurality of first chip connection pads 140h that are arranged on the upper surface of the first semiconductor chip 100h and connected to the plurality of through electrodes 120h. The first chip connection pads 140h may each be referred to as a rear pad.

The second semiconductor chips 200a may each include a second semiconductor substrate 210a having a second semiconductor device 212a formed in an active surface thereof, and a plurality of chip connection pads 220a arranged on an upper surface thereof. The chip connection pads 220a of the second semiconductor chips 200a may each be referred to as a second chip connection pad.

The first semiconductor substrate 110h, the first semiconductor device 112h, the through electrodes 120h, the wiring layer 130h, the first chip connection pads 140h, the second semiconductor substrate 210a, the second semiconductor device 212a, and the chip connection pads 220a are substantially the same as the first semiconductor substrate 110, the first semiconductor device 112, the through electrodes 120, the wiring layer 130, the first chip connection pads 140, the second semiconductor substrate 210, the second semiconductor device 212, and the chip connection pads 220, respectively illustrated in FIG. 4, and thus, redundant descriptions thereof are omitted and a difference therebetween is mainly described.

One end of each of the plurality of bonding wires 230a may be attached to a corresponding one of the chip connection pads 220a of the plurality of second semiconductor chips 200a, that is, each of the second chip connection pads 220a, and the other end of each of the plurality of bonding wires 230a may be attached to a corresponding one of the plurality of first chip connection pads 140h, that is, the rear pad.

The plurality of chip connection pads 220a may be edge pads arranged on portions adjacent to edges of upper surfaces of the second semiconductor substrate 210a, that is, portions of the upper surfaces adjacent to side surfaces of the second semiconductor substrate 210a. In some embodiments, the plurality of chip connection pads 220a may be arranged adjacent to only one side surface of each of the second semiconductor substrate 210a.

The plurality of second semiconductor chips 200a may each have the die adhesive film 250 attached to a lower surface thereof and may each be attached to a structure thereunder. The plurality of second semiconductor chips 200a may be stacked over the first semiconductor chip 100h to protrude outward from the first semiconductor chip 100h in the horizontal direction. A portion adjacent to at least one side surface of the plurality of second semiconductor chips 200a may be stacked over the first semiconductor chip 100h to overhang the first semiconductor chip 100h.

In some embodiments, horizontal widths and horizontal areas of the second semiconductor chips 200a may be greater than a horizontal width and a horizontal area of the first semiconductor chip 100h. For example, some portions of the plurality of second semiconductor chips 200a may overlap the first semiconductor chip 100h in the vertical direction, and the other may protrude outward so as not to overlap the first semiconductor chip 100h.

A supporter 190 may be between a portion of the plurality of second semiconductor chips 200a that do not overlap the first semiconductor chip 100h in the vertical direction and the redistribution structure 500. The supporter 190 may be spaced apart from the first semiconductor chip 100h on the redistribution structure 500. The supporter 190 may be formed of, for example, a semiconductor substrate such as silicon or a ceramic substrate.

An upper surface of the supporter 190 and an upper surface of the first semiconductor substrate 110h may be at the same vertical level. For example, the upper surfaces of the supporter 190 and the first semiconductor chip 100h may be coplanar. The plurality of second semiconductor chips 200a may be sequentially stacked over the first semiconductor chip 100h and the supporter 190.

A horizontal width and a horizontal area of the supporter 190 may be smaller than horizontal widths and the horizontal areas of the second semiconductor chips 200a. For example, all of the supporter 190 may vertically overlap the plurality of second semiconductor chips 200a.

At least one side surface of the plurality of semiconductor chips 200a may be aligned with at least one side surface of the supporter 190 in the vertical direction. In some embodiments, the other side opposite to one side of the second semiconductor substrate 210a on which the plurality of chip connection pads 220a are arranged adjacent to each other may be aligned with the side surface of the supporter 190 in the vertical direction.

The semiconductor package 8 may further include a molding layer 304 that surrounds the supporter 190, the first semiconductor chip 100h, the plurality of second semiconductor chips 200a, and the plurality of bonding wires 230a on the redistribution structure 500. The molding layer 304 may include, for example, an epoxy mold compound (EMC). In some embodiments, a horizontal width and a horizontal area of the molding layer 304 may have the same values as a horizontal width and a horizontal area of the redistribution structure 500. For example, a sidewall of the redistribution structure 500 may be aligned with a sidewall of the molding layer 304 in a vertical direction to form a coplanar surface.

Figure 19:
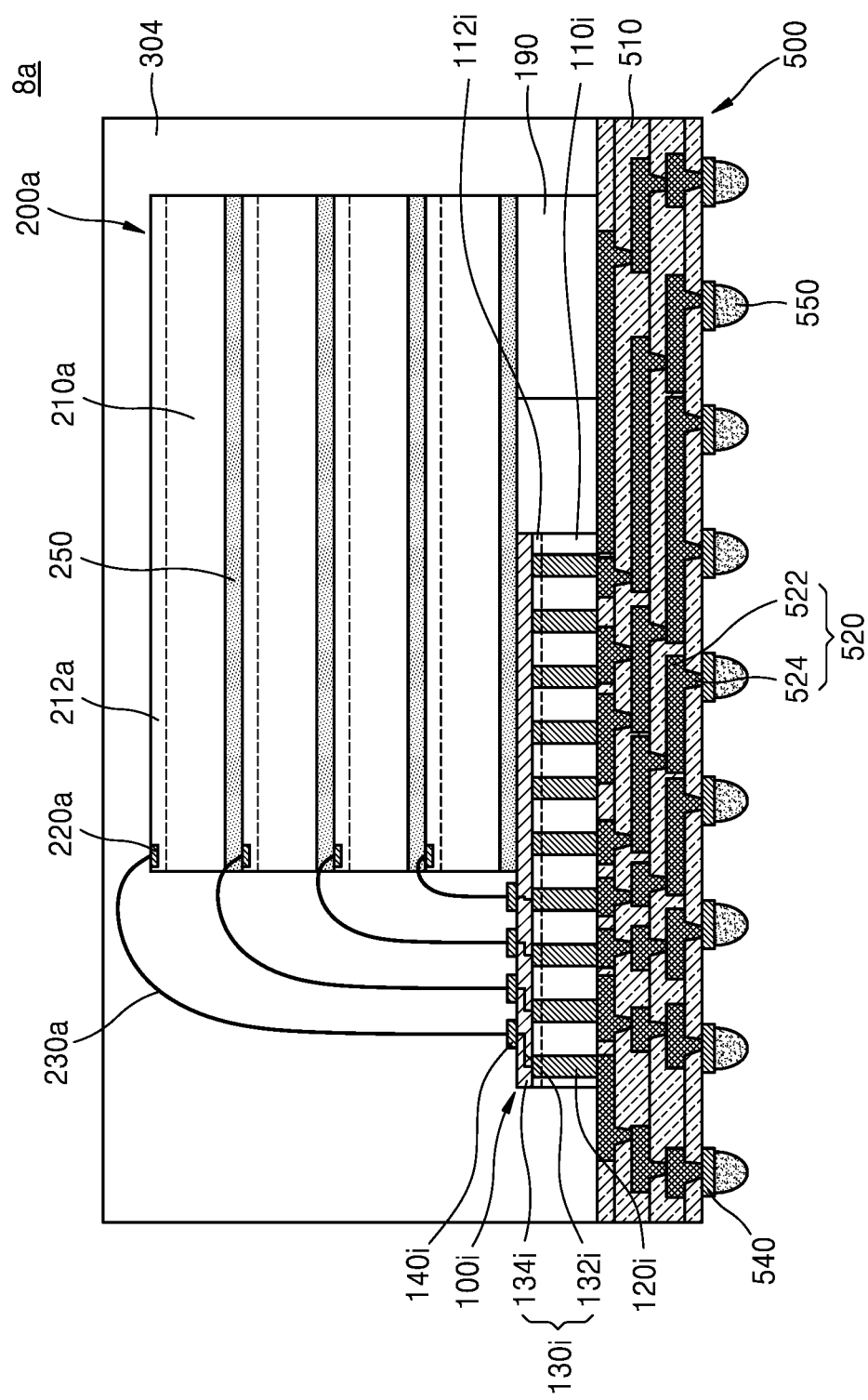

Referring to FIG. 19, the semiconductor package 8a includes the redistribution structure 500, a first semiconductor chip 100i on the redistribution structure 500, and a plurality of second semiconductor chips 200i sequentially stacked on the first semiconductor chip 100i.

The first semiconductor chip 100i may include a first semiconductor substrate 110i having a first semiconductor device 112i formed in an active surface thereof, and a wiring layer 130i which is arranged on an active surface of the first semiconductor substrate 110i and includes a plurality of conductive wiring patterns 132i and an inter-wiring insulating layer 134i. The first semiconductor chip 100i may further include a plurality of through electrodes 120i penetrating at least a portion between upper and lower surfaces of the first semiconductor chip 100i. The first semiconductor chip 100i may further include a plurality of first chip connection pads 140i which are arranged on an upper surface of the first semiconductor chip 100i and connected to the plurality of through electrodes 120i. The first chip connection pads 140i may each be referred to as a front pad.

The first semiconductor substrate 110i, the first semiconductor device 112i, the through electrodes 120i, the wiring layer 130i, and the first chip connection pads 140i are substantially the same as the first semiconductor substrate 110a, the first semiconductor device 112a, the through electrodes 120a, the wiring layer 130a, and the first chip connection pads 140a respectively illustrated in FIG. 5, and thus, redundant descriptions thereof are omitted and a difference therebetween is mainly described.

One end of each of the plurality of bonding wires 230a may be attached to a corresponding one of the chip connection pads 220a of the plurality of second semiconductor chips 200a, that is, each of the second chip connection pads 220a, and the other end of each of the plurality of bonding wires 230a may be attached to a corresponding one of the plurality of first chip connection pads 140i, that is, the front pad.

The plurality of second semiconductor chips 200a may be stacked over the first semiconductor chip 100i to protrude outward from the first semiconductor chip 100i. A portion adjacent to at least one side surface of the plurality of second semiconductor chips 200a may be stacked over the first semiconductor chip 100i to overhang the first semiconductor chip 100i.

In some embodiments, horizontal widths and horizontal areas of the second semiconductor chips 200a may be greater than a horizontal width and a horizontal area of the first semiconductor chip 100i. For example, some portions of the plurality of second semiconductor chips 200a may overlap the first semiconductor chip 100i in the vertical direction, and the other may protrude outward so as not to overlap the first semiconductor chip 100i.

The supporter 190 may be between a portion of the plurality of second semiconductor chips 200a that do not overlap the first semiconductor chip 100i in the vertical direction and the redistribution structure 500. The supporter 190 may be spaced apart from the first semiconductor chip 100 on the redistribution structure 500. An upper surface of the supporter 190 and an upper surface of the first semiconductor substrate 110i may be at the same vertical level. For example, the upper surfaces of the supporter 190 and the first semiconductor chip 100i may be coplanar. The plurality of second semiconductor chips 200a may be sequentially stacked over the first semiconductor chip 100i and the supporter 190.

The semiconductor package 8a may further include a molding layer 304 that surrounds the supporter 190, the first semiconductor chip 100i, the plurality of second semiconductor chips 200a, and the plurality of bonding wires 230a on the redistribution structure 500.

Figure 20:
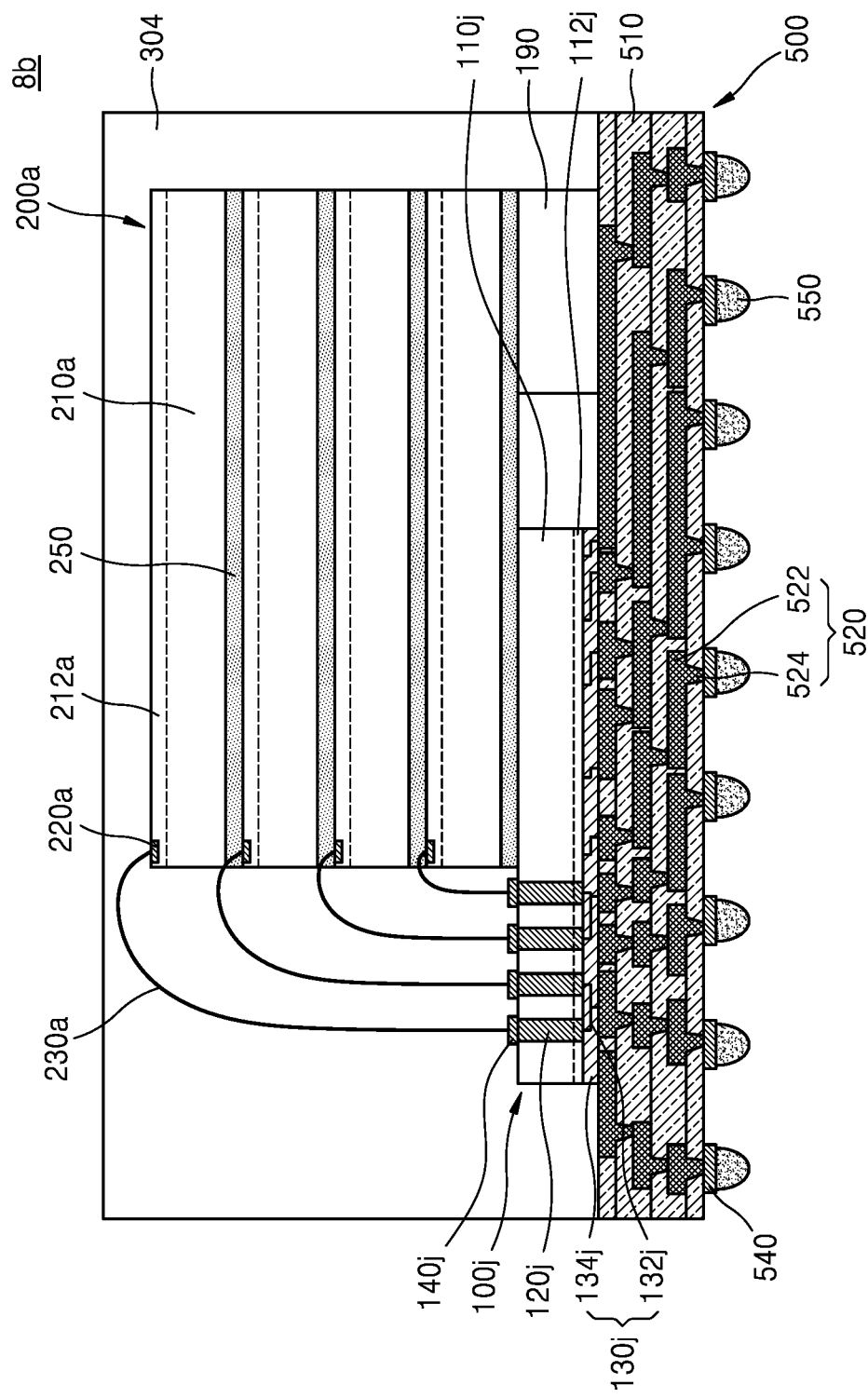

Referring to FIG. 20, a semiconductor package 8b includes the redistribution structure 500, a first semiconductor chip 100j on the redistribution structure 500, and a plurality of second semiconductor chips 200a sequentially stacked on the first semiconductor chip 100j. The first semiconductor chip 100j may include a first semiconductor substrate 110j having a first semiconductor device 112j formed in an active surface thereof, and a wiring layer 130j which is arranged on an active surface of the first semiconductor substrate 110j and includes a plurality of conductive wiring patterns 132j and an inter-wire insulating layer 134j. The first semiconductor chip 100j may further include a plurality of through electrodes 120j penetrating at least a portion between upper and lower surfaces of the first semiconductor chip 100j. The first semiconductor chip 100j may further include a plurality of first chip connection pads 140j that are arranged on an upper surface of the first semiconductor chip 100j and connected to the plurality of through electrodes 120j. The first chip connection pads 140j may each be referred to as a rear pad.

The first semiconductor substrate 110j, the first semiconductor device 112j, the through electrodes 120j, the wiring layer 130j, and the first chip connection pads 140j are substantially the same as the first semiconductor substrate 110, the first semiconductor device 112, the through electrodes 120, the wiring layer 130, and the first chip connection pads 140 respectively illustrated in FIG. 1, and thus, redundant descriptions thereof are omitted and a difference therebetween is mainly described.

The first semiconductor device 112j may include a circuit for changing a branch structure electrically connected to the plurality of second semiconductor chips 200a. In some embodiments, the first semiconductor device 112j may include a SerDes circuit. For example, the first semiconductor device 112j may change two branches connected to two data pads of the second semiconductor chips 200a to be reduced to one and the branch may reach the wiring layer 130.

The plurality of second semiconductor chips 200a may be stacked over the first semiconductor chip 100j to protrude outward from the first semiconductor chip 100j. A portion adjacent to at least one side surface of the plurality of second semiconductor chips 200a may be stacked over the first semiconductor chip 100j to overhang the first semiconductor chip 100j.

In some embodiments, horizontal widths and horizontal areas of the second semiconductor chips 200a may be greater than a horizontal width and a horizontal area of the first semiconductor chip 100j. For example, some portions of the plurality of second semiconductor chips 200a may overlap the first semiconductor chip 100j in the vertical direction, and the other may protrude outward so as not to overlap the first semiconductor chip 100j.

A supporter 190 may be between a portion of the plurality of second semiconductor chips 200a that do not overlap the first semiconductor chip 100j in the vertical direction and the redistribution structure 500. The supporter 190 may be spaced apart from the first semiconductor chip 100j on the redistribution structure 500. An upper surface of the supporter 190 and an upper surface of the first semiconductor substrate 110j may be at the same vertical level. For example, the upper surfaces of the supporter 190 and the first semiconductor chip 100j may be coplanar. The plurality of second semiconductor chips 200a may be sequentially stacked over the first semiconductor chip 100j and the supporter 190.

The semiconductor package 8b may further include a molding layer 304 that surrounds the supporter 190, the first semiconductor chip 100j, the plurality of second semiconductor chips 200a, and the plurality of bonding wires 230a on the redistribution structure 500.

Figure 21:
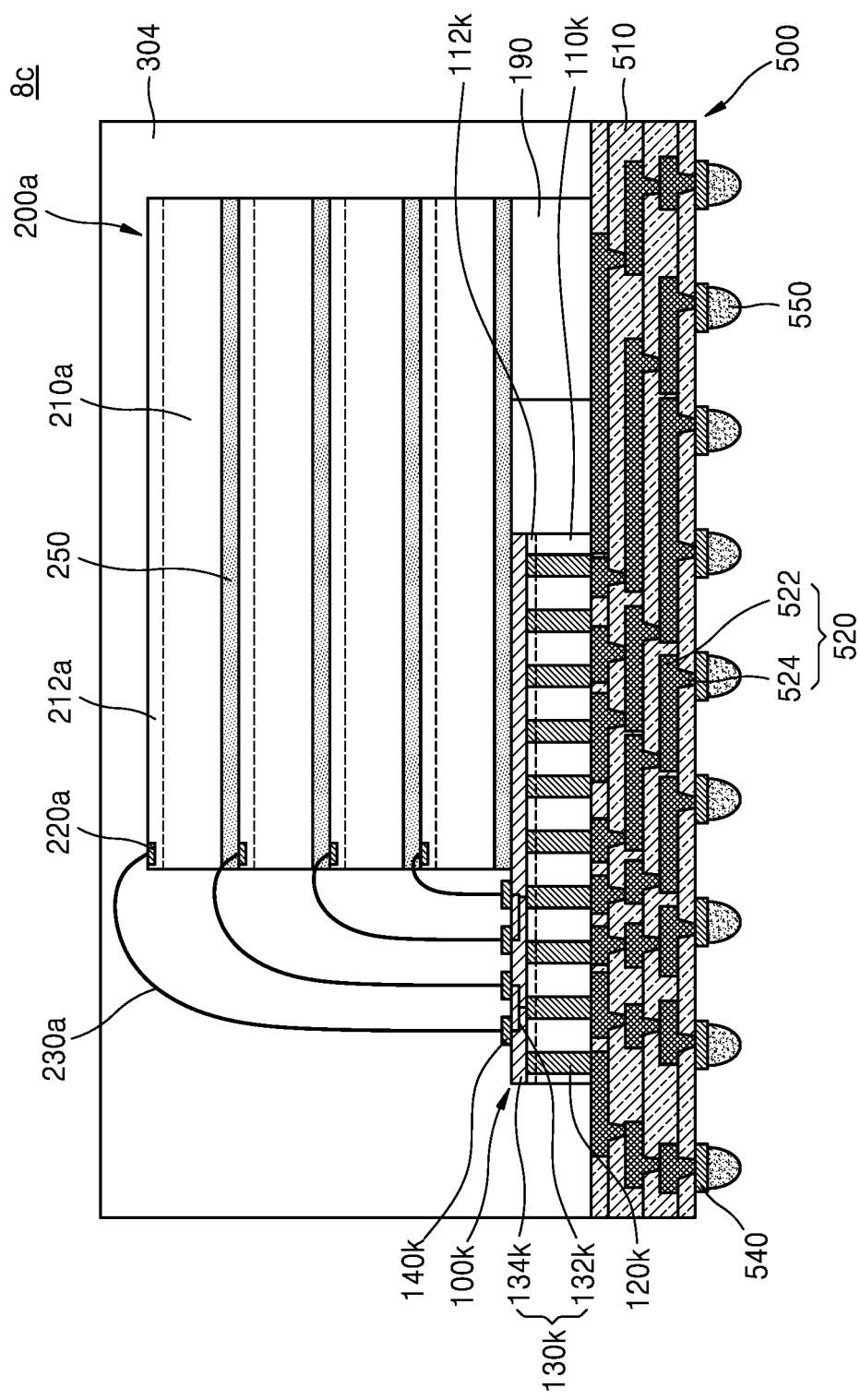

Referring to FIG. 21, a semiconductor package 8c includes the redistribution structure 500, a first semiconductor chip 100k on the redistribution structure 500, and the plurality of second semiconductor chips 200a sequentially stacked on the first semiconductor chip 100k. The first semiconductor chip 100k may include a first semiconductor substrate 110k having a first semiconductor device 112k formed in an active surface thereof, and a wiring layer 130k which is arranged on an active surface of the first semiconductor substrate 110k and includes a plurality of conductive wiring patterns 132k and an inter-wire insulating layer 134k. The first semiconductor chip 100k may further include a plurality of through electrodes 120k penetrating at least a portion between upper and lower surfaces of the first semiconductor chip 100k. The first semiconductor chip 100k may further include a plurality of first chip connection pads 140k which are arranged on an upper surface of the first semiconductor chip 100k and connected to the plurality of through electrodes 120k. The first chip connection pads 140k may each be referred to as a rear pad.

The first semiconductor substrate 110k, the first semiconductor device 112k, the through electrodes 120k, the wiring layer 130k, and the first chip connection pads 140k are substantially the same as the first semiconductor substrate 110a, the first semiconductor device 112a, the through electrodes 120a, the wiring layer 130a, and the first chip connection pads 140a, respectively, and thus, redundant descriptions thereof are omitted and a difference therebetween is mainly described.

The first semiconductor device 112k may include a circuit for changing a branch structure electrically connected to the plurality of second semiconductor chips 200a. In some embodiments, the first semiconductor device 112k may include a SerDes circuit. For example, the first semiconductor device 112k may change two branches connected to two data pads of the second semiconductor chips 200a to be reduced to one and the branch may reach the through electrode 120k.

The plurality of second semiconductor chips 200a may be stacked over the first semiconductor chip 100k to protrude outward from the first semiconductor chip 100k. A portion adjacent to at least one side surface of the plurality of second semiconductor chips 200a may be stacked over the first semiconductor chip 100k to overhang the first semiconductor chip 100k.

In some embodiments, horizontal widths and horizontal areas of the second semiconductor chips 200a may be greater than a horizontal width and a horizontal area of the first semiconductor chip 100k. For example, some portions of the plurality of second semiconductor chips 200a may overlap the first semiconductor chip 100k in the vertical direction, and the other may protrude outward so as not to overlap the first semiconductor chip 100k.

A supporter 190 may be between a portion of the plurality of second semiconductor chips 200a that do not overlap with the first semiconductor chip 100k in the vertical direction and the redistribution structure 500. The supporter 190 may be spaced apart from the first semiconductor chip 100k on the redistribution structure 500. An upper surface of the supporter 190 and an upper surface of the first semiconductor substrate 110k may be at the same vertical level. For example, the upper surfaces of the supporter 190 and the first semiconductor chip 100k may be coplanar. The plurality of second semiconductor chips 200a may be sequentially stacked over the first semiconductor chip 100k and the supporter 190.

The semiconductor package 8c may include a molding layer 304 that surrounds the supporter 190, the first semiconductor chip 100k, the plurality of second semiconductor chips 200a, and the plurality of bonding wires 230a on the redistribution structure 500.

Figure 22:
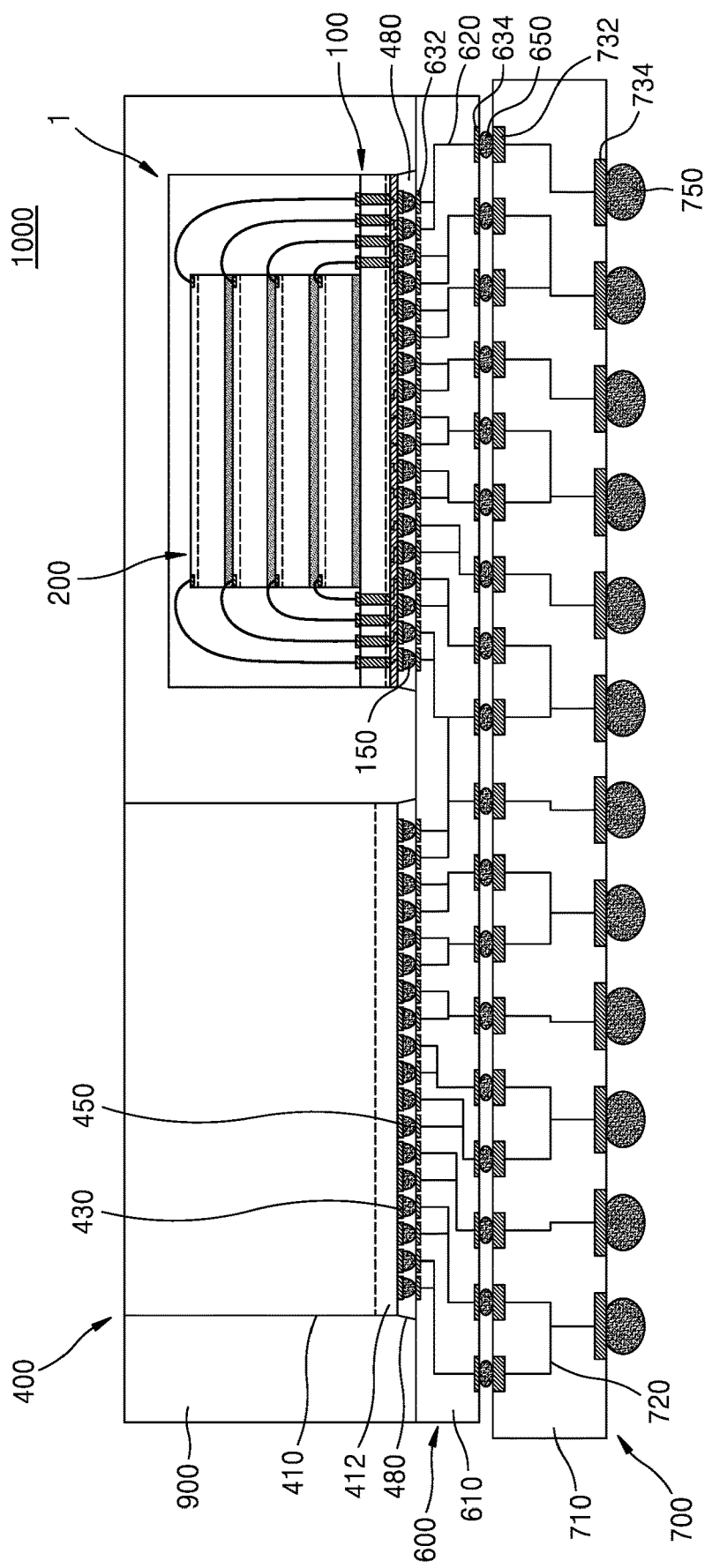
FIGS. 22 and 23 are cross-sectional views illustrating a system including a semiconductor package, according to an example embodiment of the inventive concept.
Figure 23:
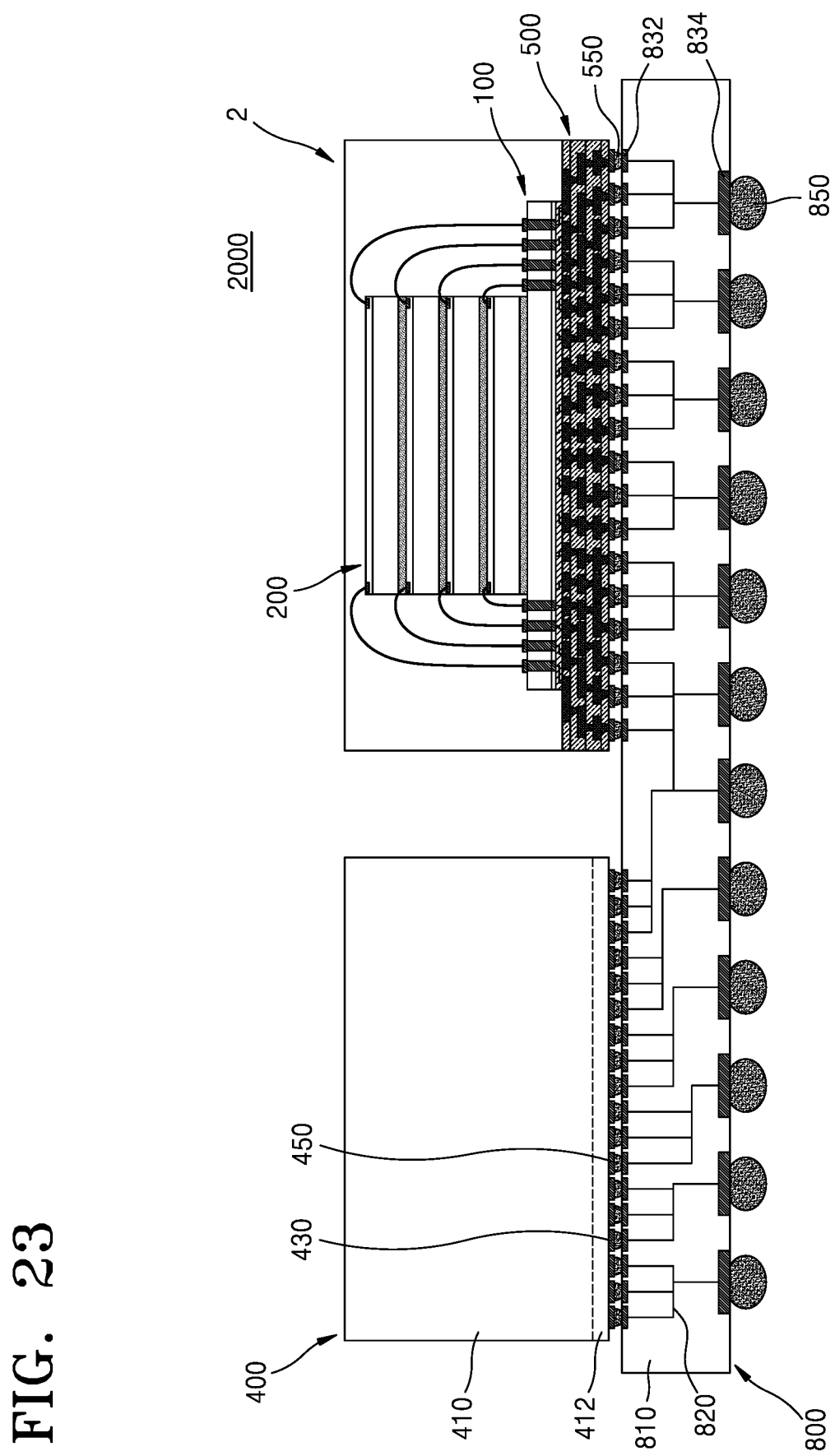

FIGS. 22 and 23 are cross-sectional views illustrating a system including a semiconductor package, according to embodiments of the inventive concept.

Referring to FIG. 22, a system 1000 may include the semiconductor package 1 including the first semiconductor chip 100 and the plurality of second semiconductor chips 200, an interposer 600 to which a third semiconductor chip 400 is attached, and a main board 700 on which the interposer 600 is mounted.

The third semiconductor chip 400 may include a third semiconductor substrate 410, a third semiconductor device 412, a plurality of third chip connection pads 430, and a plurality of chip connection terminals 450. The third semiconductor substrate 410, the third semiconductor device 412, the third chip connection pads 430, and the chip connection terminals 450 are substantially the same as the first semiconductor substrate 110, the first semiconductor device 112, the front pads 142, and the external connection terminals 150, respectively, and thus, redundant descriptions thereof are omitted.

The third semiconductor chip 400 may include, for example, a central processing unit (CPU) chip, a graphic processing unit (GPU) chip, or an application processor (AP) chip.

The interposer 600 may include an interposer insulating layer 610 and an interposer conductive structure 620. A plurality of interposer upper surface pads 632 and a plurality of interposer lower surface pads 634 electrically connected to each other through the interposer conductive structure 620 may be respectively arranged on upper and lower surfaces of the interposer 600. In some embodiments, the interposer conductive structure 620 may electrically connect the semiconductor package 1 to the third semiconductor chip 400.

In some embodiments, the interposer 600 may be a redistribution interposer formed by a method similar to the redistribution structure 500 illustrated in FIG. 4. The interposer insulating layer 610 and the interposer conductive structure 620 are substantially the same as the redistribution insulating layer 510 and the redistribution conductive structure 520, respectively illustrated in FIG. 4, and thus, redundant descriptions thereof are omitted.

The plurality of external connection terminals 150 of the semiconductor package 1 and the plurality of chip connection terminals 450 of the third semiconductor chip 400 may be attached to the plurality of interposer upper surface pads 632. An underfill layer 480 may be between the semiconductor package 1 and the interposer 600, and between the third semiconductor chip 400 and the interposer 600. The underfill layer 480 may surround the plurality of external connection terminals 150 and the third connection bump 460.

A plurality of interposer connection terminals 650 may be attached to the plurality of interposer lower surface pads 634. In some embodiments, the interposer connection terminals 650 may each be a conductive bump or a solder ball. The interposer connection terminals 650 may electrically connect the interposer 600 to the main board 700.

In some embodiments, an encapsulant 900 may be formed on the interposer 600 to surround the semiconductor package 1 and the third semiconductor chip 400. The encapsulant 900 may be formed of, for example, a thermosetting resin.

The main board 700 may include a base board layer 710, a plurality of board upper pads 732 and a plurality of board lower pads 734 respectively arranged on an upper surface and a lower surface of the base board layer 710, and a board conductive structure 720 electrically connecting the plurality of board upper pads 732 to the plurality of board lower pads 734. In some embodiments, the board conductive structure 720 may electrically connect the semiconductor package 1 to the third semiconductor chip 400.

In some embodiments, the main board 700 may be a printed circuit board. For example, the main board 700 may be a multi-layer printed circuit board. The base board layer 710 may be formed of at least one material selected from a phenol resin, an epoxy resin, and polyimide. The base board layer 710 may include at least one material selected from, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

Solder resist layers (not illustrated) exposing the board upper pads 732 and the board lower pads 734 may be respectively formed on an upper surface and a lower surface of the base board layer 710. The plurality of interposer connection terminals 650 may be attached to the plurality of board upper pads 732, and a plurality of system connection terminals 750 may be attached to the plurality of board lower pads 734. The system connection terminals 750 may each be, for example, a solder ball.

In some embodiments, the system 1000 may not include the main board 700, and the interposer connection terminals 650 may function as system connection terminals.

Referring to FIG. 23, a system 2000 may include the redistribution structure 500, the semiconductor package 2 including the first semiconductor chip 100 and the plurality of second semiconductor chips 200, and a main board 800 having the third semiconductor chip 400 mounted thereon.

The main board 800 may include a base board layer 810, a plurality of board upper pads 832 and a plurality of board lower pads 834 respectively arranged on an upper surface and a lower surface of the base board layer 810, and a board conductive structure 820 electrically connecting the plurality of board upper pads 832 to the plurality of board lower pads 834. The main board 800 is substantially the same as the main board 700 illustrated in FIG. 19, and thus, redundant descriptions thereof are omitted.

The plurality of external connection terminals 550 of the semiconductor package 2 and the plurality of chip connection terminals 450 of the third semiconductor chip 400 may be attached to the plurality of board upper pads 832. A plurality of system connection terminals 850 may be attached to the plurality of board lower pads 834.

While the inventive concept has been particularly shown and described with reference to embodiments thereof, it will be understood that various changes in form and details may be made therein without departing from the spirit and scope of the following claims.

What is claimed is:

1. A semiconductor package comprising:
 a redistribution structure configured to include a redistribution insulating layer, a plurality of redistribution line patterns arranged on at least one of an upper surface and a lower surface of the redistribution insulating layer, and a plurality of redistribution vias which penetrate the redistribution insulating layer to be respectively connected and in contact with some of the plurality of redistribution line patterns and which increasingly extend from a lower side to an upper side of each of the redistribution vias;
 a logic semiconductor chip arranged on the redistribution structure and configured to include a first semiconductor substrate, a wiring layer which is arranged on an active surface of the first semiconductor substrate and includes a plurality of conductive wiring patterns and an inter-wire insulating layer surrounding the plurality of conductive wiring patterns, a plurality of first chip connection pads arranged on an upper surface, and a plurality of through electrodes which are connected to the plurality of first chip connection pads and penetrate the first semiconductor substrate;
 a plurality of dynamic random access memory (DRAM) chips configured to each have a die adhesive film attached to a lower surface of each of the plurality of DRAM chips so that edges of the plurality of DRAM chips are aligned with each other in a vertical direction and sequentially stacked over an active surface of the first semiconductor substrate, and configured to include a second semiconductor substrate, a DRAM device controlled by the logic semiconductor chip, and a plurality of second chip connection pads arranged on an upper surface of each of the plurality of DRAM chips, and configured to have a data bus having a width of 16 to 64 bits;
 a plurality of bonding wires configured to each include one end attached to a corresponding one of the plurality of first chip connection pads and the other end attached to a corresponding one of the plurality of second chip connection pads and the plurality of bonding wires are configured to extend from the plurality of second chip connection pads to the plurality of first chip connection pads;

a molding layer configured to cover an upper surface of the redistribution structure and configured to surround the plurality of DRAM chips and the plurality of bonding wires; and
a plurality of external connection terminals attached to a lower surface of the redistribution structure,
wherein the plurality of through electrodes do not overlap the plurality of DRAM chips when viewed in a plan view, and
wherein lower surfaces of the plurality of through electrodes directly contact uppermost ones of the plurality of redistribution line patterns.

2. The semiconductor package of claim 1, wherein a sidewall of the redistribution structure is aligned with a sidewall of the molding layer in the vertical direction.

3. A semiconductor package comprising:
a first semiconductor chip configured to include a first semiconductor device, a first semiconductor substrate, a plurality of through electrodes penetrating the first semiconductor substrate, and a plurality of first chip connection pads arranged on an upper surface of the first semiconductor substrate;
a plurality of second semiconductor chips sequentially stacked on an upper surface of the first semiconductor chip and configured to each include a second semiconductor substrate, a second semiconductor device controlled by the first semiconductor chip, and a plurality of second chip connection pads arranged on an upper surface of the second semiconductor substrate;
a plurality of bonding wires, each of the plurality of bonding wires configured to include one end attached to a corresponding one of the plurality of first chip connection pads and the other end attached to a corresponding one of the plurality of second chip connection pads;
a molding layer configured to surround the plurality of second semiconductor chips and the plurality of bonding wires;
a plurality of external connection terminals arranged below a lower surface of the first semiconductor substrate, and
a redistribution structure arranged first semiconductor chip and be plurality of external connection terminals and configured to include a redistribution insulating layer and a plurality of redistribution line patterns arranged on at least one of an upper surface and a lower surface of the redistribution insulating layer and
wherein the lower surfaces of the plurality of through electrodes directly contact uppermost ones of the plurality of redistribution line patterns,
wherein the plurality of through electrodes do not overlap the plurality of second semiconductor chips when viewed in a plan view.

4. The semiconductor package of claim 3,
wherein the plurality of external connection terminals are attached to a plurality of external connection pads arranged on a lower surface of the first semiconductor chip, and
wherein the molding layer is arranged on the first semiconductor chip to cover an upper surface of the first semiconductor chip and to surround the plurality of second semiconductor chips and the plurality of bonding wires, and a horizontal width of the molding layer is the same as a horizontal width of the first semiconductor chip.

5. The semiconductor package of claim 3, further comprising:

an interposer including an interposer insulating layer, a plurality of interposer upper surface pads on an upper surface of the interposer insulating layer, a plurality of interposer lower surface pads on a lower surface of the interposer insulating layer, an interposer conductive structure in the interposer insulating layer electrically connecting the plurality of interposer upper surface pads and the plurality of interposer lower surface pads,
wherein the plurality of external connection terminals are attached to some portions of the plurality of interposer upper surface pads.

6. The semiconductor package of claim 5, further comprising:
a third semiconductor chip configured to include a third semiconductor device, a third semiconductor substrate, and a plurality of third chip connection pads arranged on a lower surface of the third semiconductor substrate; and
a plurality of chip connection terminals between the plurality of third chip connection pads and other portions of the plurality of interposer upper surface pads.

7. The semiconductor package of claim 3, wherein at least a portion of the plurality of second semiconductor chips protrudes outward from the first semiconductor chip to overhang the first semiconductor chip.

8. The semiconductor package of claim 3,
wherein the plurality of external connection terminals are attached to a lower surface of the redistribution structure.

9. The semiconductor package of claim 8, further comprising:
a main board including a base board layer, a plurality of board upper pads on an upper surface of the base board layer, a plurality of board lower pads on a lower surface of the base board layer, and a board conductive structure in the base board layer electrically connecting the plurality of board upper pads to the plurality of board lower pads,
wherein the plurality of external connection terminals are attached to some portions of the plurality of board upper pads.

10. The semiconductor package of claim 9, further comprising:
a third semiconductor chip configured to include a third semiconductor device, a third semiconductor substrate, and a plurality of third chip connection pads arranged on a lower surface of the third semiconductor substrate; and
a plurality of chip connection terminals between the plurality of third chip connection pads and other portions of the plurality of board upper pads.

11. The semiconductor package of claim 3, wherein the molding layer is arranged on the first semiconductor chip to cover an upper surface of the redistribution structure and to surround the first semiconductor chip, the plurality of second semiconductor chips, and the plurality of bonding wires, and a horizontal width of the molding layer is the same as a horizontal width of the redistribution structure.

12. The semiconductor package of claim 3, further comprising:
a supporter arranged on the redistribution structure to be spaced apart from the first semiconductor chip and configured to include an upper surface at the same vertical level as the upper surface of the first semiconductor substrate, wherein the plurality of second semiconductor chips are stacked over the first semiconductor chip and the supporter.

13. The semiconductor package of claim 3,
wherein each of the plurality of second semiconductor chips is electrically connected to the first semiconductor chip through different bonding wires among the plurality of bonding wires, and
wherein the plurality of bonding wires directly connect the plurality of second chip connection pads of each of the plurality of second semiconductor chips corresponding to each other to the plurality of first chip connection pads of the first semiconductor chip.

14. The semiconductor package of claim 3,
wherein the plurality of second semiconductor chips each include a die adhesive film attached to a lower surface thereof and are sequentially stacked on the first semiconductor chip to overlap each other in a vertical direction, and
wherein one end of each of the plurality of bonding wires connected to the plurality of second chip connection pads of the second semiconductor chips other than an uppermost second semiconductor chip among the plurality of second semiconductor chips is buried in the die adhesive film.

15. A semiconductor package comprising:
a redistribution structure configured to include a redistribution insulating layer, a plurality of redistribution line patterns arranged on at least one of an upper surface and a lower surface of the redistribution insulating layer;
a first semiconductor chip arranged on the redistribution structure and configured to include a first semiconductor substrate including a first semiconductor device, a wiring layer arranged on an active surface of the first semiconductor substrate and including a plurality of conductive wiring patterns and an inter-wire insulating layer surrounding the plurality of conductive wiring patterns, a plurality of through electrodes penetrating the first semiconductor substrate and electrically connected to the first semiconductor device, a plurality of first chip connection pads arranged on an upper surface of the first semiconductor chip
a plurality of second semiconductor chips configured to each include a second semiconductor substrate having a die adhesive film attached to a lower surface of each of the second semiconductor chips and stacked on an upper surface of the first semiconductor chip, a second semiconductor device controlled by the first semiconductor chip, and a plurality of second chip connection pads arranged on an upper surface of each of the second semiconductor chips;
a plurality of bonding wires, each of the plurality of bonding wires configured to include one end attached to a corresponding one of the plurality of first chip connection pads and the other end attached to a corresponding one of the plurality of second chip connection pads;
a molding layer configured to cover the upper surface of the first semiconductor chip and configured to surround the plurality of second semiconductor chips and the plurality of bonding wires;
a plurality of external connection pads arranged below a lower surface of the first semiconductor substrate, and
a plurality of external connection terminals attached to the plurality of external connection pads,
wherein one end of each of the plurality of through electrodes is electrically connected to a corresponding one of the plurality of external connection pads, and
wherein the plurality of through electrodes do not overlap the plurality of second semiconductor chips when viewed in a plan view, and
wherein the lower surfaces of the plurality of through electrodes directly contact uppermost ones of the plurality of redistribution line patterns.

16. The semiconductor package of claim 15, further comprising:
an interposer including an interposer insulating layer, a plurality of interposer upper surface pads on an upper surface of the interposer insulating layer, a plurality of interposer lower surface pads on a lower surface of the interposer insulating layer, an interposer conductive structure in the interposer insulating layer electrically connecting the plurality of interposer upper surface pads and the plurality of interposer lower surface pads,
wherein the plurality of external connection terminals are attached to some portions of the plurality of interposer upper surface pads.

17. The semiconductor package of claim 16, further comprising:
a third semiconductor chip configured to include a third semiconductor device, a third semiconductor substrate, and a plurality of third chip connection pads arranged on a lower surface of the third semiconductor substrate; and
a plurality of chip connection terminals between the plurality of third chip connection pads and other portions of the plurality of interposer upper surface pads.

18. The semiconductor package of claim 15, wherein a sidewall of the first semiconductor chip is aligned with a sidewall of the molding layer in a vertical direction to form the same plane.

19. The semiconductor package of claim 15,
wherein each of the plurality of second semiconductor chips is a dynamic random access memory (DRAM) chip configured to include a DRAM device and to have a data bus having a width of 16 bits to 64 bits,
wherein the first semiconductor chip is a logic semiconductor chip including a circuit for controlling the DRAM device of each of the plurality of second semiconductor chips, and
wherein a width of a data bus of the semiconductor package is 64 to 256 bits.

20. The semiconductor package of claim 15,
wherein some portions of the plurality of second semiconductor chips are sequentially stacked on the upper surface of the first semiconductor chip so that edges are aligned with each other in a vertical direction, and
wherein other portions of the plurality of second semiconductor chips are spaced apart from the some portions of the plurality of second semiconductor chips and sequentially stacked on the upper surface of the first semiconductor chip so that edges are aligned in the vertical direction.

* * * * *